United States Patent
Murayama et al.

(10) Patent No.: US 6,233,711 B1
(45) Date of Patent: May 15, 2001

(54) TURBO CODING, DECODING DEVICES AND TURBO CODING, DECODING METHODS

(75) Inventors: Jun Murayama, Tokyo (JP); Robert J. McEliece, Sony Corporation 7-35 Kitashinagawa 6-chome, Shinagawa-Ku, Tokyo 141 (JP); Masayuki Hattori, Kanagawa (JP)

(73) Assignees: Sony Corporation, Tokyo (JP); Robert J. McEliece, Pasadena, CA (US)

( * ) Notice: Subject to any disclaimer, the term of this patent is extended or adjusted under 35 U.S.C. 154(b) by 0 days.

(21) Appl. No.: 09/310,161

(22) Filed: Apr. 30, 1999

Related U.S. Application Data

(63) Continuation of application No. PCT/JP98/03933, filed on Sep. 2, 1998.

(30) Foreign Application Priority Data

Sep. 2, 1997 (JP) .................................................. 9-237424

(51) Int. Cl.⁷ .................................................. H03M 13/03

(52) U.S. Cl. .......................................... 714/786; 375/265

(58) Field of Search ................................... 714/786–787; 375/140, 145, 146, 367, 265, 262, 341

(56) References Cited

U.S. PATENT DOCUMENTS

| | | | |
|---|---|---|---|
| 5,537,420 | * 7/1996 | Huang | 714/792 |
| 5,574,735 | * 11/1996 | Takada, et al. | 714/788 |
| 5,600,664 | * 2/1997 | Hayashi | 714/792 |
| 5,721,745 | * 2/1998 | Hladik et al. | 714/792 |
| 5,734,962 | * 3/1998 | Hladik et al. | 455/12.1 |
| 5,737,345 | * 4/1998 | Pelz et al. | 714/792 |
| 5,949,796 | * 9/1999 | Kumar | 370/529 |
| 5,970,098 | * 10/1999 | Herzberg | 375/264 |
| 5,983,384 | * 11/1999 | Ross | 714/788 |
| 5,996,104 | * 11/1999 | Herzberg | 714/755 |
| 5,999,570 | * 12/1999 | Chaki | 375/281 |
| 6,005,894 | * 12/1999 | Kumar | 375/270 |
| 6,023,783 | * 2/2000 | Divsalar et al. | 714/792 |

OTHER PUBLICATIONS

Benedetto, et al., Performance of Continous and Blockwise Decoded Turbo Codes, IEEE, May 1997.*

Cheng, et al., Performance of Trellis Coded Direct–Sequence Spread–Spectrum Multiple–Access with Non–Coherent Reception in a Fading Environment, IEEE, May 1996.*

Dolinar, et al., Weight Distribution for Turbo Codes using Random and Non–Random Permutations, Jet Propulsion Laboratory, Aug. 1995.*

Divsalar, et al. Hybrid Concatenated Codes and Iterative Decoding, Jet Propulsion Laboratory, Aug. 1997.*

S. Dolinar and D. Divsalar, "Weight Distributions for Turbo Codes Using Random and Nonrandom Permutations", The Telecommunications and Data Acquisition Report 42*122, Jet Propulsion Laboratory, Aug. 15, 1995, pp. 56–65.

(List continued on next page.)

*Primary Examiner*—Albert Decady
*Assistant Examiner*—Guy Lamarre
(74) *Attorney, Agent, or Firm*—Frommer Lawrence & Haug, LLP; William S. Frommer; Darren M. Simon

(57) ABSTRACT

A device for encoding turbo codes for use in satellite communications. Input data including termination bits are supplied to a series of interleaver circuits. Coding circuits perform convolution operations on data output from the respective interleavers, thereby obtaining coded data. The encoding process automatically results in terminated coded data. Thus, termination circuits are unnecessary. The determination of substitute positions by the respective interleavers through arithmetic computations makes it unnecessary to provide separate memory to store substitute position information.

20 Claims, 19 Drawing Sheets

OTHER PUBLICATIONS

D. Divsalar and F. Pollara, "Hybrid Concatenated Codes and Iterative Decoding", The Telecommunications and Data Acquisition Report 42–130, Jet Propulsion Laboratory, Aug. 15, 1997, pp. 1–23.

S. Benedetto, D. Divsalar, G. Montorsi, and F. Pollara, "Serial Concatenation of Interleaved Codes: Performance Analysis, Design and Iterative Decoding", The Telecommunications and Data Acquisition Report 42–126, Jet Propulsion Laboratory, Aug. 15, 1996, pp. 1–26.

W.J. Blackert, E.K. Hall and S.G. Wilson, "Turbor Code termination and interleaver conditions", Electronics Letters, vol. 31, No. 24, Nov.23, 1995, pp. 2082–84.

P. Jung and m Naβhan, "Dependence of the error Performance of turbo–codes on the interleaver structure in short frame transmission systems", Electronics Letters, vol. 30, No. 4, Feb. 17, 1994, pp. 287–88.

* cited by examiner

F I G. 1 7 (PRIOR ART)
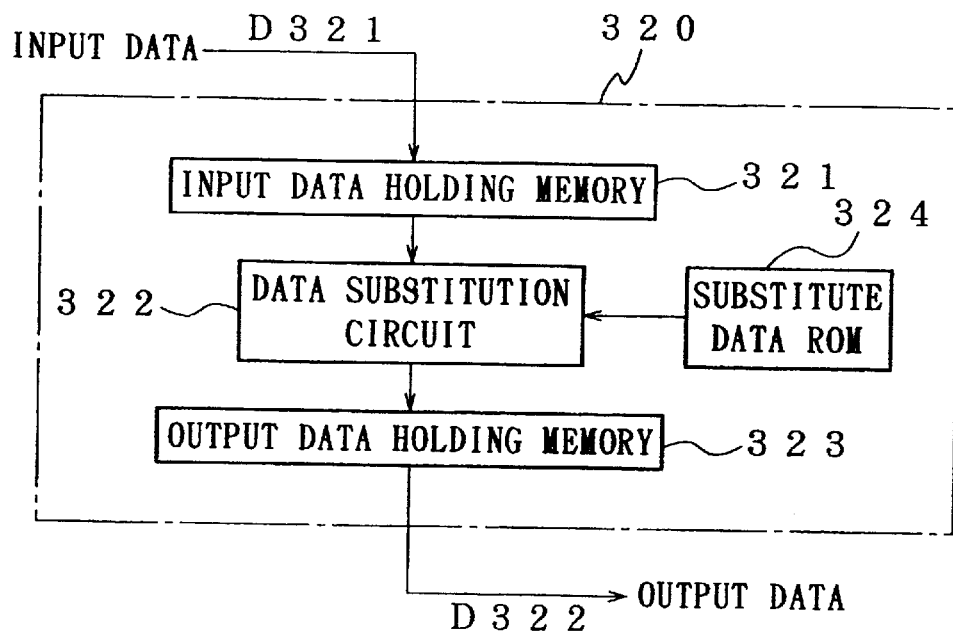
F I G. 1 8 (PRIOR ART)
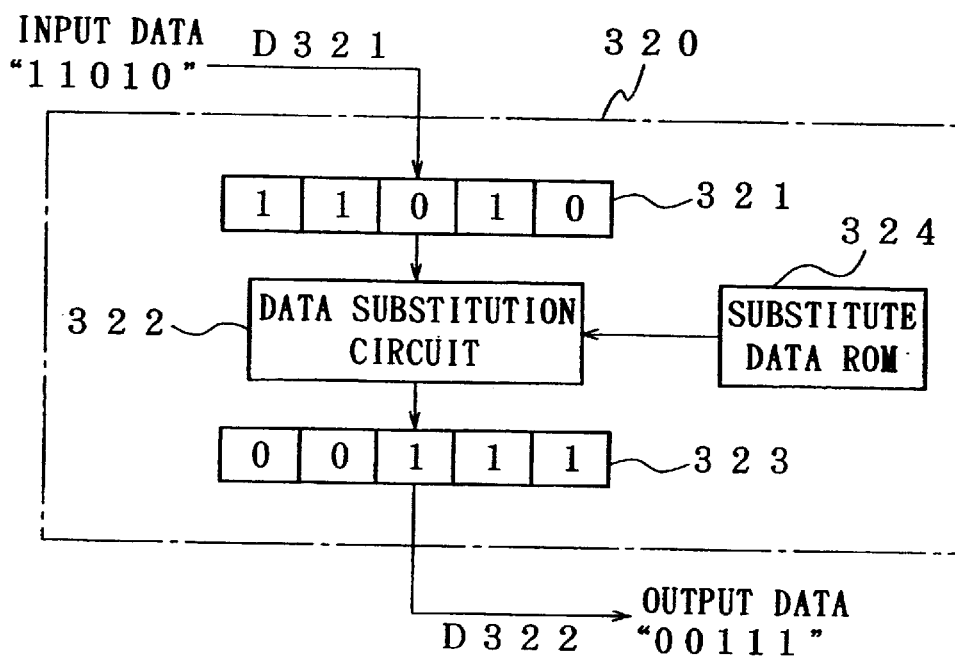

| POSITION OF INPUT DATA | 0 | 1 | 2 | 3 | 4 |
|---|---|---|---|---|---|
| POSITION OF SUBSTITUTED DATA | 4 | 2 | 0 | 3 | 1 |

TURBO CODING, DECODING DEVICES AND TURBO CODING, DECODING METHODS

This is a continuation of copending International Application PCT/JP98/03933 having an international filing date of Sep. 2, 1998.

TECHNICAL FIELD

This invention relates to turbo coding and decoding devices and turbo coding and decoding methods suitable for application to encoding and decoding of turbo codes employed in satellite communications or the like, for example.

BACKGROUND ART

A turbo code is known as a code indicative of the performance close to the Shannon limit corresponding to a theoretical limit of the code performance. As to the turbo code, coding is performed by a combination of a plurality of convolution coding circuits and interleave circuits (hereinafter called "interleavers"). On the decoding side, the transfer of information about input data is performed between decoding circuits for outputting a plurality of soft outputs thereby to obtain the final result of decoding.

FIG. 15 shows a configuration of a conventional turbo coding device 300. The turbo coding device 300 has a convolution coding circuit 301-1 for performing convolutional coding on input data D301 thereby to obtain coded data D302-1, interleavers 302-1 through 302-(m−1) for successively interleaving the input data D301, and convolution coding circuits 301-2 through 301-m for respectively performing convolutional coding on data outputted from these interleavers 302-1 through 302-(m−1) thereby to obtain coded data D302-2 through D302-m. Here, m is an integer greater than or equal to 2.

The convolution coding circuits 301-1 through 301-m perform convolutional arithmetic operations on the input data and output the results of arithmetic operations as coded data, respectively. Further, the interleavers 302-1 through 302-(m−1) interleave the sequence of respective data in the input data and output the so-processed data therefrom.

FIG. 16 shows one example of the convolution coding circuits 301-1 through 301-m. The convolution coding circuit 310 shown in FIG. 16 is a feedback type convolution coding circuit having a bound length 3. This coding circuit 310 has two shift registers 311-1 and 311-2, three exclusive OR circuits (hereinafter called "EXOR circuits") 312-1 through 312-3, and a termination circuit 313, and generates coded data D312 from input data D311.

Here, the shift registers 311-1 and 311-2 respectively serve as delay elements for delaying the input data by one unit time interval. Further, the EXOR circuits 312-1 through 312-3 output EXORing of the input data respectively. The termination circuit 313 outputs the input data D311 until the coding of all the input data D311 is brought to an end, and outputs feedback data D313 by two unit time intervals (times corresponding to the number of shift registers) from the completion of the coding. Processing subsequent to the coding of all the input data D311 is one for restoring all the contents of shift registers 311-1 and 311-2 to 0, which is called "termination". On the decoding side, decoding is performed on the assumption of this processing.

FIG. 17 shows one example of the interleavers 302-1 through 302-(m−1). The interleaver 320 shown in FIG. 17 has an input data holding memory 321, a data substitution circuit 322, an output data holding memory 323 and a substitute data ROM (Read Only Memory) 324, and interleaves the sequence of respective data related to input data D321 thereby to obtain output data D322.

Here, the input data D321 are temporarily stored in the input data holding memory 321 and thereafter the order of the data is re-arranged or sorted by the data substitution circuit 322. The sorting of the sequence of the data is performed based on the contents of the substitute data ROM 324, i.e., substitute position information. Each of the data whose sequence is sorted, are stored in the output data holding memory 323 from which they are thereafter outputted as the output data D322.

FIG. 18 shows an example of the operation of the interleaver 320 at the time that the size of the interleaver 320 is 5 and the contents of the substitute data ROM 324 are the ones shown in FIG. 19. That is, when the input data D321 are given as "11010", "00111" is obtained as the output data D322.

The operation of the turbo coding device 300 shown in FIG. 15 will be explained. The input data D301 are supplied to the convolution coding circuit 301-1. The convolution coding circuit 301-1 performs a convolutional arithmetic operation on the input data D301, followed by termination. Thus, the convolution coding circuit 301-1 outputs coded data D302-1 obtained by a coding process including the termination.

The input data D301 are supplied to a series circuit of the interleavers 302-1 through 302-(m−1), where the sequence of the successively-input data are interleaved and the so-processed data are outputted. These output data of the interleavers 302-1 through 302-(m−1) are respectively supplied to the convolution coding circuits 301-2 through 301-m. The convolution coding circuits 301-2 through 301-m respectively perform convolutional arithmetic operations on the output data of the interleavers 302-1 through 302-(m−1), followed by termination, so that coded data D302-2 through D302-m obtained by a coding process including the termination are outputted.

FIG. 20 shows the relationship between the numbers of bits for the input data D301 and the coded data D302-1 through D302-m employed in the turbo coding device 300. The input k-bit data D301 are subjected to coding processes including termination by the respective convolution coding circuits 301-1 through 301-m and thereafter the so-processed respective data are outputted as $(n_1+t_1)$ through $(n_m+t_m)$-bit coded data D302-1 through D302-m.

FIG. 21 shows a configuration of a conventional turbo decoding device 400. The turbo decoding device 400 has a plurality of soft output decoding circuits 401-1 through 401-m corresponding to the number of the coded data (received data) outputted from the turbo coding device 300. The soft output decoding circuits 401-1 through 401-m are constructed respectively by using a so-called soft output decoding system such as a MAP (Maximum A posteriori Probability) decoder and a SOVA (Soft Output Viterbi Algorithm) decoder or the like, having the function of calculating the probability that input data on the coding side will take 0 or 1.

The operation of the turbo decoding device 400 shown in FIG. 21 will be described. Received data (coded data) D401-1 through D401-m are respectively supplied to the soft output decoding circuits 401-1 through 401-m. The respective decoding circuits 401-1 through 401-m respectively perform a repetitive decoding operation several times or several tens of times, utilizing estimated probability-value data with respect to the input data excluding termination bits on the coding sides with one another. The final decoded data D402 are outputted from an arbitrary decoding circuit (corresponding to the decoding circuit 401-1 in FIG. 21).

FIG. 22 shows the relationship between the numbers of bits for the received data D401-1 through D401-m, estimated probability-value data and decoded data D402 employed in the turbo decoding device 400 and corresponds to the relationship between the respective numbers of bits employed in the turbo coding device 300 shown in FIG. 15. The soft output decoding circuits 401-1 through 401-m respectively calculate k-bit estimated probability-value data with respect to the input data excluding the termination bits from the $(n_1+t_1)$ through $n_m+t_m)$-bit received data D401-1 through D401-m. Thereafter, the k-bit estimated probability-value data are transferred between the respective decoding circuits, so that the k-bit decoded data D402 are finally outputted.

Meanwhile, in the aforementioned turbo coding device 300, the interleavers 302-1 through 302-(m-1) need substitute data ROM 324 with substitute position information stored therein respectively, and the convolution coding circuits 301-1 through 301-m need termination circuits 313 respectively, thereby leading to an increase in circuit scale.

Since the coded data outputted from the turbo coding device 300 before the termination are generated from the common input data, the transfer of the estimated probability-value data for the input data can be performed between the decoding circuits 401-1 through 401-m in the turbo decoding device 400. However, since different input data are generally supplied according to the state of the convolution coding circuits and the coded data outputted upon termination are generated from the input data, the transfer of estimated probability-value data with respect to input data at termination therebetween cannot be performed, thus resulting in degradation in decoding performance.

An object of the present invention is to provide a turbo coding device and a turbo decoding device or the like reduced in circuit scale and improved in decoding performance.

DISCLOSURE OF THE INVENTION

A turbo coding device according to the present invention is constructed so as to have two or more convolution coding circuits, and one or more interleave circuits, and wherein the interleave circuits respectively have an arithmetic unit for computing substitute positions for respective data in input data. The turbo coding device includes, for example, a first convolution coding circuit for performing convolutional coding on input data, first to (m-1)th (where m: greater than or equal to 2) interleave circuits for successively interleaving the input data, and second to mth convolution coding circuits for respectively performing convolution coding on data outputted from the first to (m-1)th interleave circuits. Further, the turbo coding device includes, for example, a first convolution coding circuit for performing convolutional coding on input data, and a series circuit of first to (m-1)th (where m: integer greater than or equal to 2) interleave circuits and second to mth convolution coding circuits, which alternately perform interleave and convolutional coding processes on data outputted from the first convolution coding circuit.

Further, a turbo coding method according to the present invention comprises a coding step for performing convolutional coding, and an interleave step for performing interleave, wherein substitute positions for respective data in data to be interleaved are determined by computation in the interleave step. The turbo coding method has, for example, a first coding step for performing convolutional coding on input data, an interleave step for successively interleaving the input data, and a second coding step for respectively performing convolutional coding on the data successively interleaved in the interleave step. Further, the turbo coding method has, for example, a first coding step for performing convolutional coding on input data, and an interleave/coding step for performing interleave and convolutional coding on coded data obtained in the first coding step once or plural times.

In the present invention, for example, the first convolution coding circuit performs convolutional arithmetic operations on the input data and effects termination thereon, thereby outputting coded data. Further, the input data are supplied to the series circuit of the first to (m-1)th interleave circuit. The respective interleave circuits interleave the sequence of respective data in the input data and output the so-processed data therefrom, respectively. The second to mth convolution coding circuits respectively perform convolutional arithmetic operations on data outputted from the respective interleave circuits, followed by termination, thereby outputting coded data therefrom.

In this case, the respective interleave circuits determine substitute positions by computation without obtaining substitute position information from a substitute data ROM. For example, substitute positions $\pi i$ corresponding to positions i for respective data in input data are determined from $\pi i=(a \cdot i+b) \bmod N$ with the size of each interleave circuit as N, an integer prime relative to N with each other as a and an arbitrary integer as b. Further, for example, substitute positions $\pi i$ corresponding to positions i for respective data in input data are determined from $\pi i=(a \cdot \pi_{i-1}+b) \bmod N$ (where $\pi_0 = c \bmod N$ when c is defined as an arbitrary integer) with the size of each interleave circuit as N, and predetermined integers as a and b. Moreover, for example, substitute positions $\pi i$ corresponding to positions i for respective data in input data are determined by an M series generating circuit.

Owing to the determination of the substitute positions with the respective interleave circuits by computation in this way, a substitute data ROM or the like with substitute position information stored therein becomes unnecessary for each interleave circuit, so that a circuit scale can be reduced.

A turbo coding device according to the present invention comprises a first convolution coding circuit for performing convolutional coding on input data, first to (m-1)th (where m: integer greater than or equal to 2) interleave circuits for respectively successively interleaving all the input data including termination bits in the first convolution coding circuit, and second to mth convolution coding circuits for respectively performing convolutional coding on data outputted from the first to (m-1)th interleave circuits, and wherein the interleave circuits interleave respective data in the input data so that the second to mth convolution coding circuits are also terminated simultaneously with the termination of the first convolution coding circuit with a plurality of portions divided according to positions of the respective data as the reference.

Further, a turbo coding method according to the present invention comprises a first coding step for performing convolutional coding on input data, an interleave step for respectively successively interleaving all the input data including termination bits in the first convolution coding step, and a second coding step for respectively performing convolutional coding on the data successively interleaved in the interleave step, wherein in the interleave step, respective data in input data are interleaved so that coding circuits are terminated even in the second coding step simultaneously with the time when a coding circuit is terminated in the first coding step with a plurality of portions divided according to positions of the respective data as the reference.

In the present invention, the first convolution coding circuit performs convolutional arithmetic operations on input data and further performs termination thereon thereby outputting coded data. Further, all the input data including termination bits in the first convolution coding circuit are supplied to a series circuit of the first to (m−1)th interleave circuits. The respective interleave circuits interleave the sequence of respective data in the input data and output the so-processed data therefrom. The second to mth convolution coding circuits respectively perform convolutional arithmetic operations on data outputted from the respective interleave circuits thereby to output coded data.

In this case, the respective interleave circuits interleave the respective data in the input data so that the second to mth convolution coding circuits are also terminated simultaneously with the termination of the first convolution coding circuit with a plurality of portions divided according to positions of the respective data as the reference. For example, the respective interleave circuits perform interleave with each individual inner parts of the plurality of portions or each individual of the plurality of portions as units.

In the second to mth convolution coding circuits as described above, termination processing is automatically performed without termination circuits, so that a circuit scale can be reduced.

Further, a turbo decoding device according to the present invention, for decoding coded data obtained by a turbo coding device comprising a first convolution coding circuit for performing convolutional coding on input data, first to (m−1)th (where m: integer greater than or equal to 2) interleave circuits for respectively successively interleaving all the input data including termination bits in the first convolution coding circuit, and second to mth convolution coding circuits for respectively performing convolutional coding on data outputted from the first to (m−1)th interleave circuits, wherein the interleave circuits interleave respective data in the input data so that the second to mth convolution coding circuits are also terminated simultaneously with the termination of the first convolution coding circuit with a plurality of portions divided according to positions of the respective data as the reference, comprises a plurality of soft output decoding circuits for decoding the coded data, wherein the plurality of soft output decoding circuits perform a transfer of estimated probability-value data with respect to all the input data including termination bits therebetween thereby to decode the coded data.

Moreover, a turbo decoding method according to the present invention, for decoding coded data obtained by a turbo coding method comprising a first coding step for performing convolutional coding on input data, an interleave step for successively interleaving all the input data including termination bits in the first coding step, and a second coding step for respectively performing convolutional coding on data successively interleaved in the interleave step, wherein in the interleave step, respective data in data to be interleaved are interleaved so that coding circuits are terminated even in the second coding step simultaneously with the termination of a coding circuit in the first coding step with a plurality of portions divided according to positions of the respective data as the reference, comprises a decoding step for decoding the coded data by using a plurality of soft output decoding circuits, wherein in the decoding step, a transfer of estimated probability-value data with respect to all the input data including termination bits is performed between the plurality of soft output decoding circuits thereby to decode the coded data.

In the present invention, received data corresponding to a plurality of coded data obtained in a turbo coding device are supplied to a plurality of soft output decoding circuits. The respective decoding circuits respectively perform a repetitive decoding operation several times or several tens of times, utilizing estimated probability-value data with respect to input data on the coding side with one another. The final decoded data are obtained from an arbitrary decoding circuit. Here, the plurality of coded data are those all generated from the same data inclusive of data at termination. The transfer of estimated probability-value data for all the input data including termination bits is performed between the respective decoding circuits, thereby decoding the received data. It is thus possible to improve decoding performance.

BRIEF DESCRIPTION OF THE DRAWINGS

FIG. 17 is a block diagram illustrating a configuration of an interleaver employed in the conventional turbo coding device;

7

Figures 19, 21:
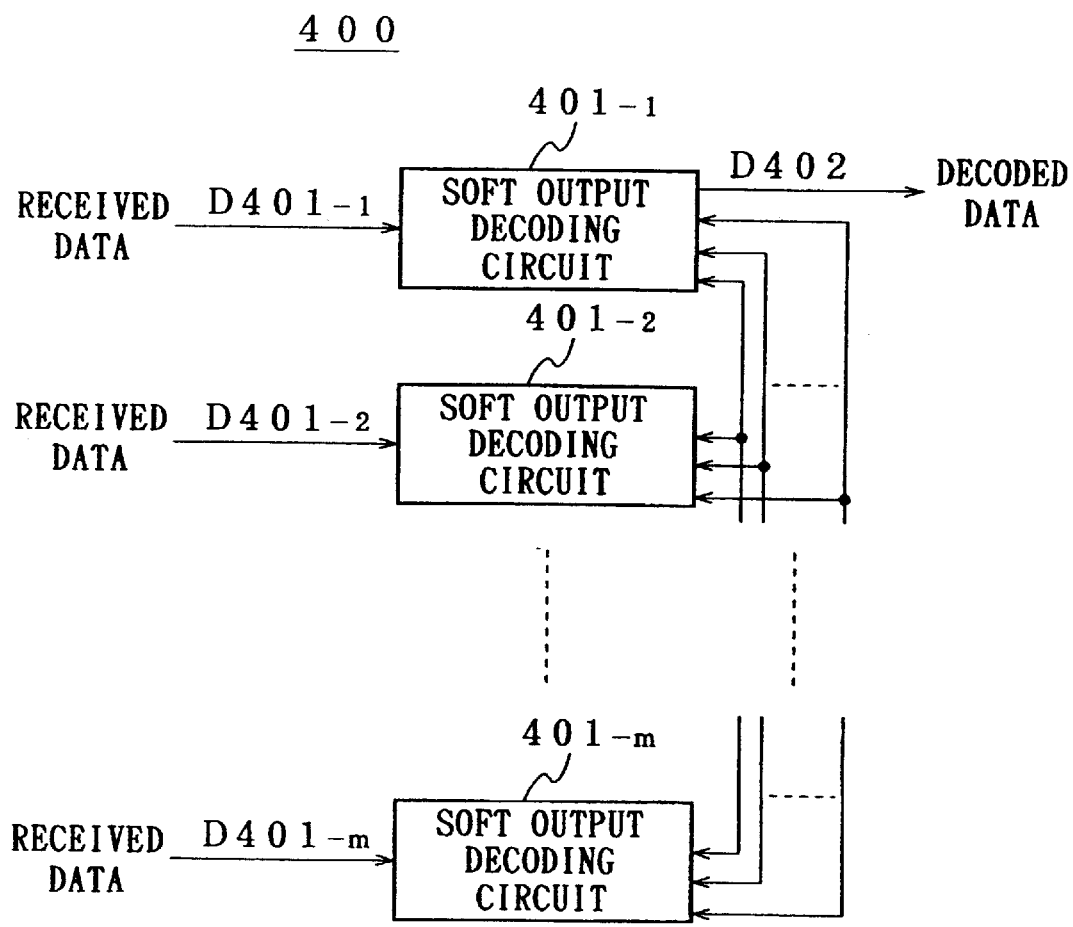
Figure 20:
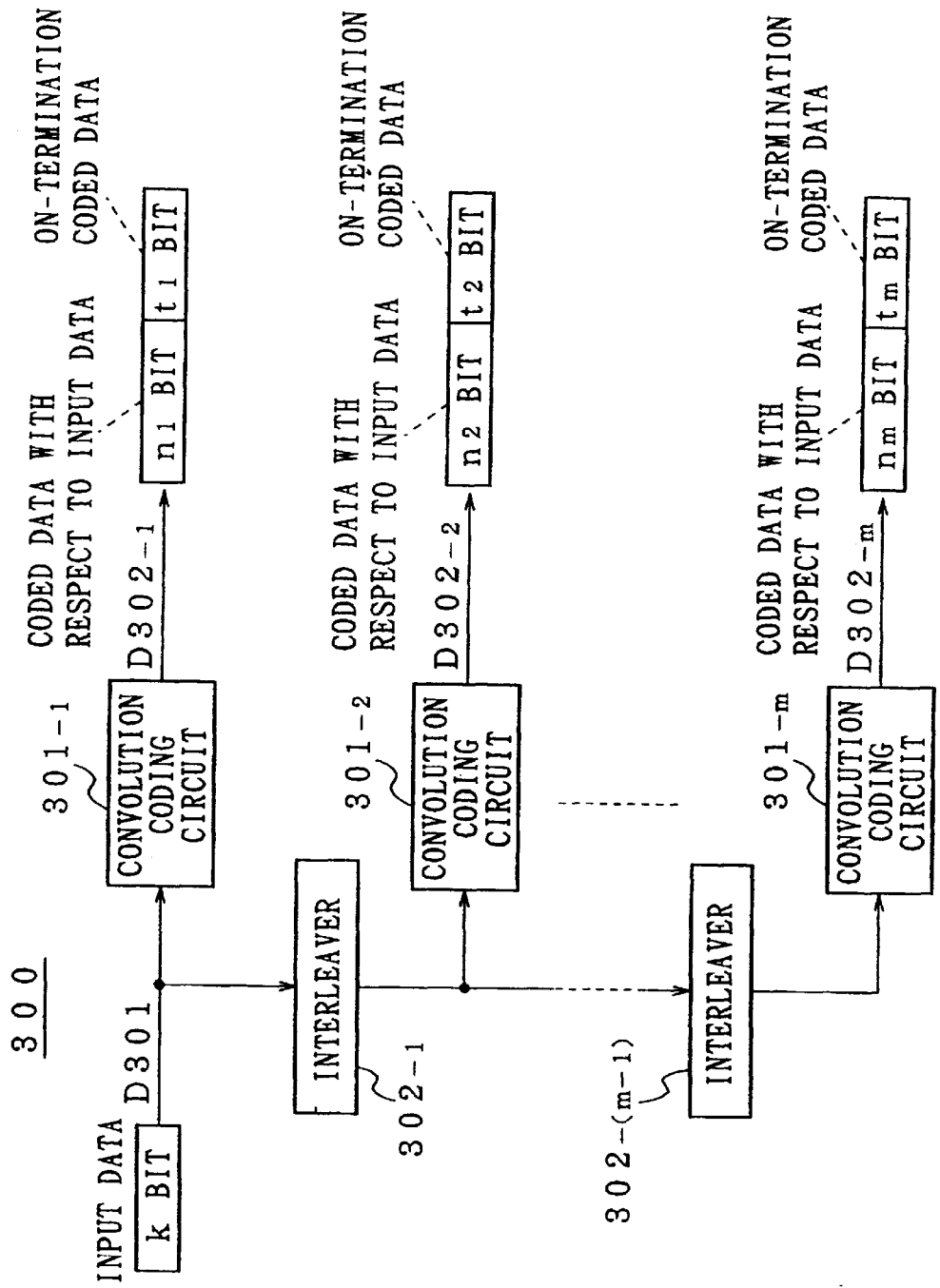
Figure 22:
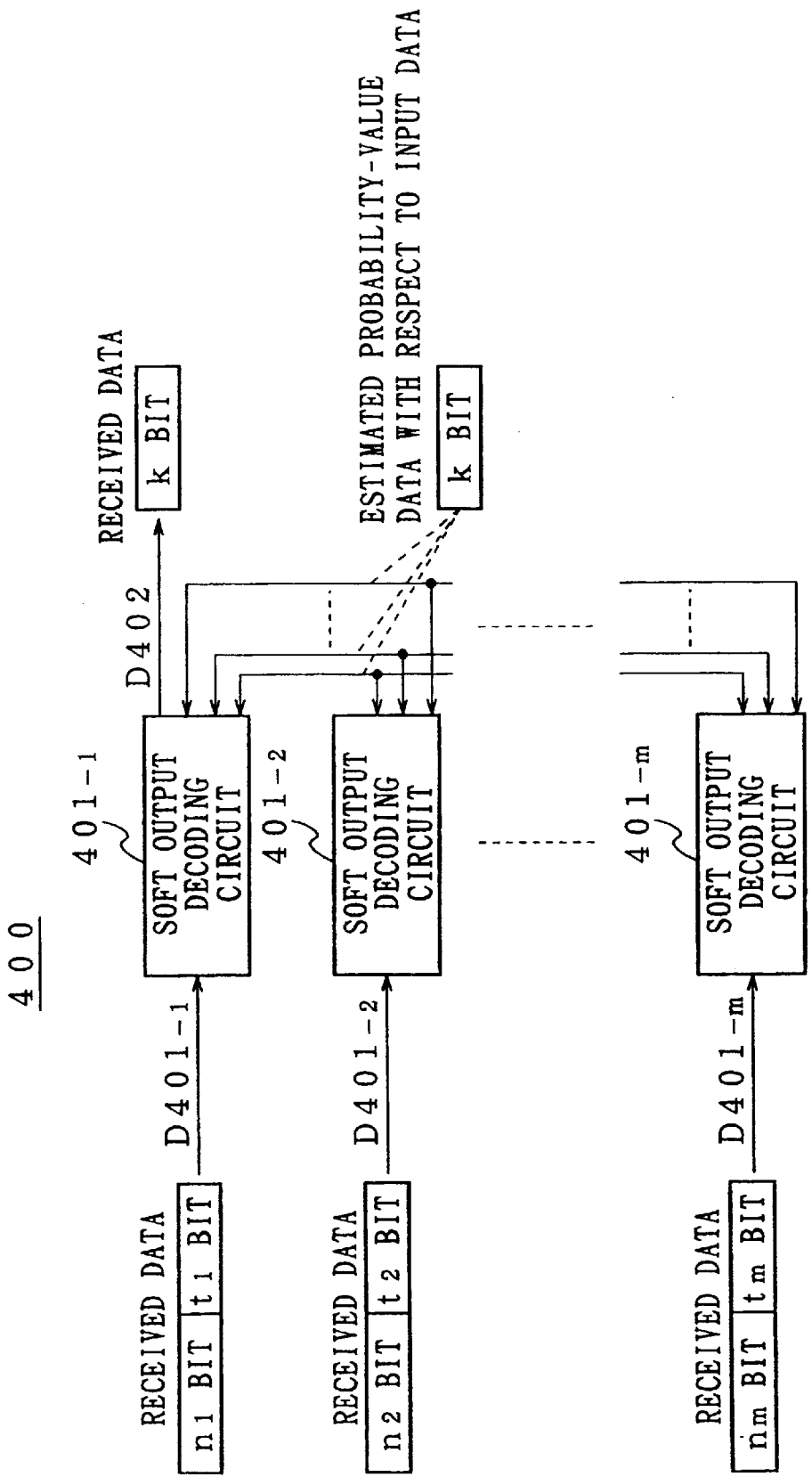

FIG. 18 is a diagram depicting an example of the operation of the interleaver employed in the conventional turbo coding device;

FIG. 19 is a diagram showing an example of the contents of a substitute data ROM which constitutes the interleaver employed in the conventional turbo coding device;

FIG. 20 is a diagram illustrating the relationship between the numbers of bits for input data and coded data employed in the conventional turbo coding device;

FIG. 21 is a block diagram depicting a configuration of a conventional turbo decoding device; and FIG. 22 is a diagram showing the relationship between the numbers of bits for received data, estimated probability-value data and decoded data employed in the conventional turbo decoding device.

BEST MODE FOR CARRYING OUT THE INVENTION

Figure 1:
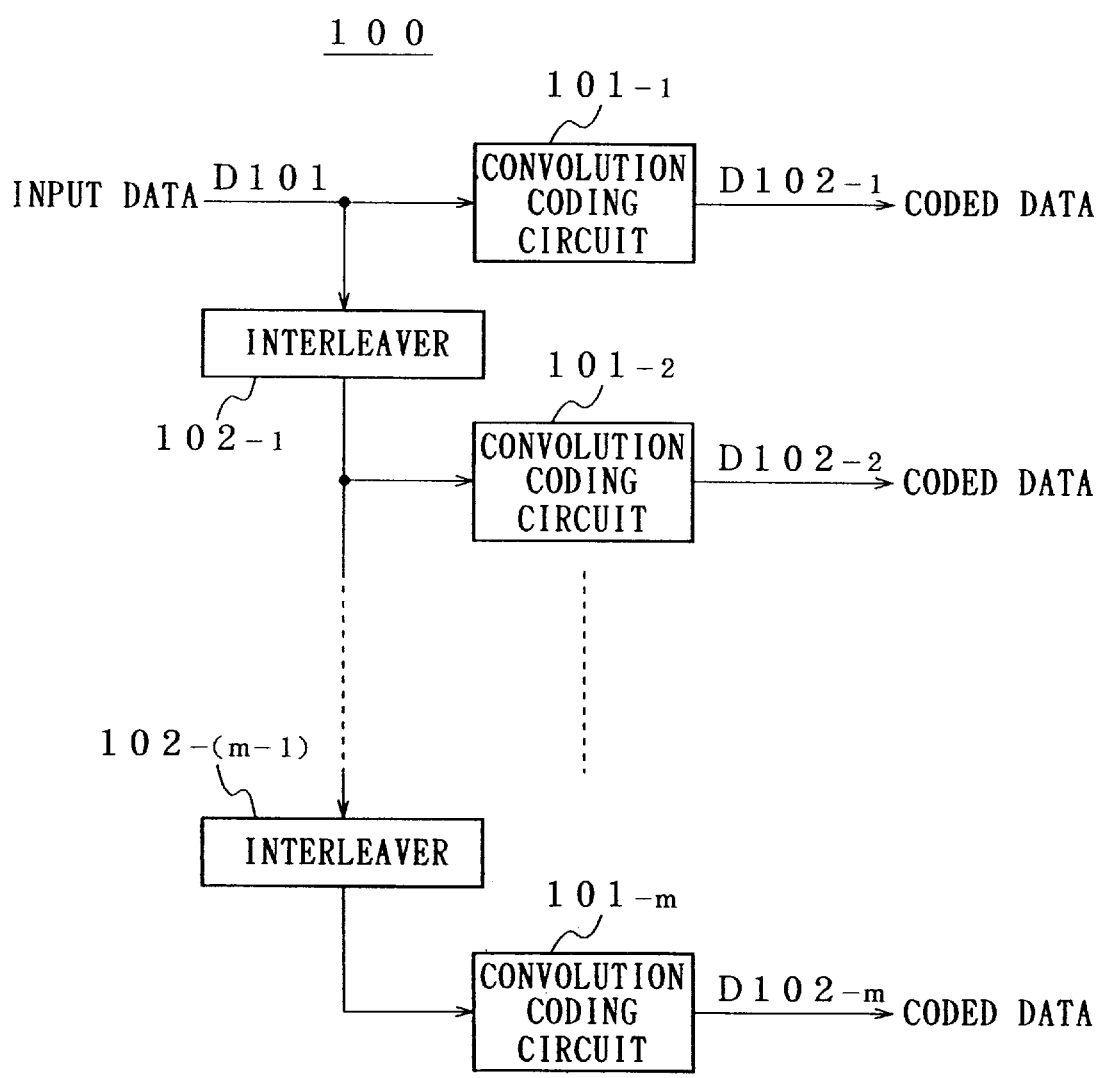
FIG. 1 is a block diagram showing a configuration of a turbo coding device defined as an embodiment 1.

FIG. 1 is a diagram showing a configuration of a parallel-type turbo coding device 100 employed as an embodiment 1. The present turbo coding device 100 has a convolution coding circuit 101-1 for performing convolution coding on input data D101 thereby to obtain coded data D102-1, (m−1) interleavers 102-1 through 102-(m−1) for successively interleaving the input data D101, and (m−1) convolution coding circuits 101-2 through 101-m for respectively effecting convolution coding on data outputted from these interleavers 102-1 through 102-(m−1) thereby to obtain coded data D102-2 through D102-m. Here, m indicates an integer greater than or equal to 2.

The convolution coding circuits 101-1 through 101-m perform convolutional arithmetic operations on the input data and output the results of arithmetic operations as coded data therefrom, respectively. Further, the interleavers 102-1 through 102-(m−1) respectively interleave the sequence of respective data in the input data and output the so-processed data therefrom. The convolution coding circuits 101-1 through 101-m are respectively constructed in a manner similar to the convolution coding circuits 301-1 through 301-m employed in the conventional turbo coding device 300 shown in FIG. 15 (see FIG. 16).

Figure 2:
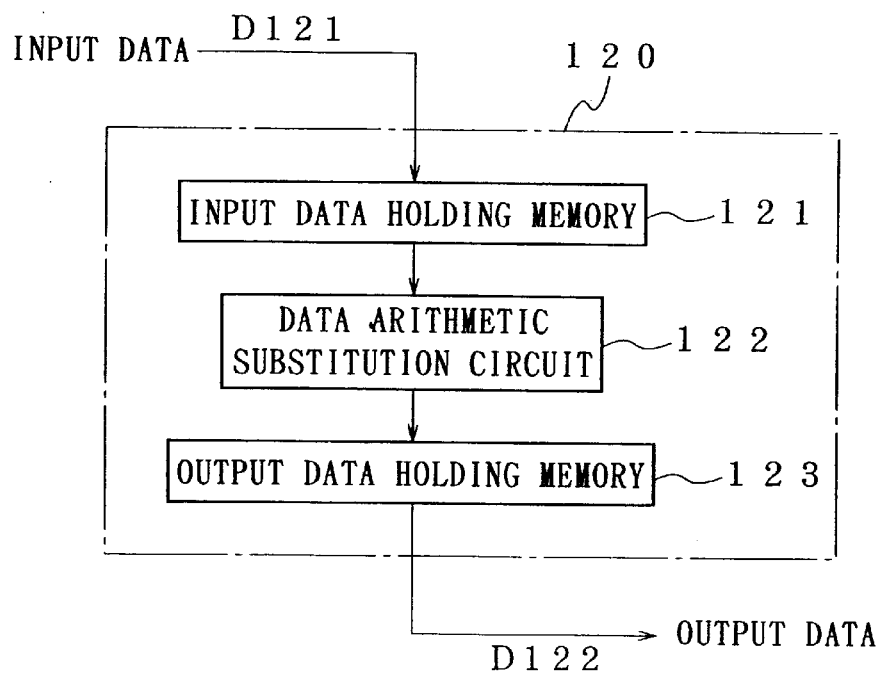
FIG. 2 is a block diagram illustrating a configuration of an interleaver employed in the embodiment 1.

FIG. 2 shows a configuration of each of the interleavers 102-1 through 102-(m−1). The interleaver 120 shown in FIG. 2 has an input data holding memory 121, a data arithmetic substitution circuit 122 and an output data holding memory 123, and interleaves the sequence of respective data related to input data D121 thereby to obtain output data D122. Here, the input data D121 are temporarily stored in the input data holding memory 121 and thereafter the order of the respective data is re-arranged by the data arithmetic substitution circuit 122. The respective data whose sequence is re-arranged are stored in the output data holding memory 123 from which they are thereafter outputted as the output data D122.

In the above-described data arithmetic substitution circuit 122, data at their positions i are replaced by their corresponding positions $\pi_i$ calculated by the following equation (1) according to positions i of the input respective data. In the equation (1), N indicates the size of the interleaver 120, i.e., the sizes of the input data holding memory 121 and the output data holding memory 123. Further, a and b indicate predetermined values respectively. Additionally, a indicates an integer prime relative to N with each other and b indicates an arbitrary integer.

$$\pi_i = (a \cdot i + b) \bmod N \tag{1}$$

8

Figure 3:
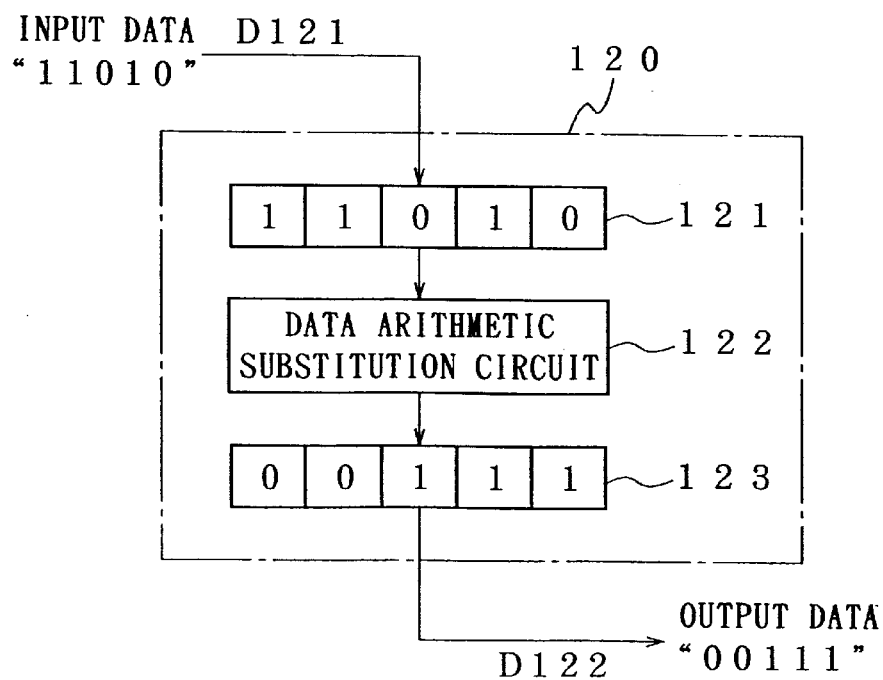
FIG. 3 is a diagram depicting an example of the operation of the interleaver employed in the embodiment 1.

FIG. 3 shows an example of the operation of the interleaver 120 at the time that the substitute position $\pi_i$ is determined when N=5 and a=3 and b=4 in the equation (1). That is, when the input data D121 are given as "11010", "00111" are obtained as the output data D122. In other words, the interleaver 120 performs the same operation as that of an interleaver 320 shown in FIG. 18.

Incidentally, the data arithmetic substitution circuit 122 may determine the substitute positions $\pi_i$ by the following equation (2) in place of the equation (1).

$$\pi_i = (a \cdot \pi_{i-1} + b) \bmod N, \ (\pi_0 = c \bmod N) \tag{2}$$

Where N indicates the size of the interleaver 120, and constants a, b and c indicate predetermined values respectively. When b=0, a becomes an integer which meets $a^p \neq$ ($2 \leq p \leq N-2$) and c indicates an arbitrary integer. When b ≠0, N in the equation is set to a number reduced by one from the size of the holding memory and a and b are respectively selected so as to meet the following conditions. Further, c is an arbitrary integer.

i) b and N are prime with each other;
ii) a−1 is a multiple of all the prime numbers which divide N; and
iii) If N is a multiple of four, then a−1 is also the multiple of four.

Figure 4:
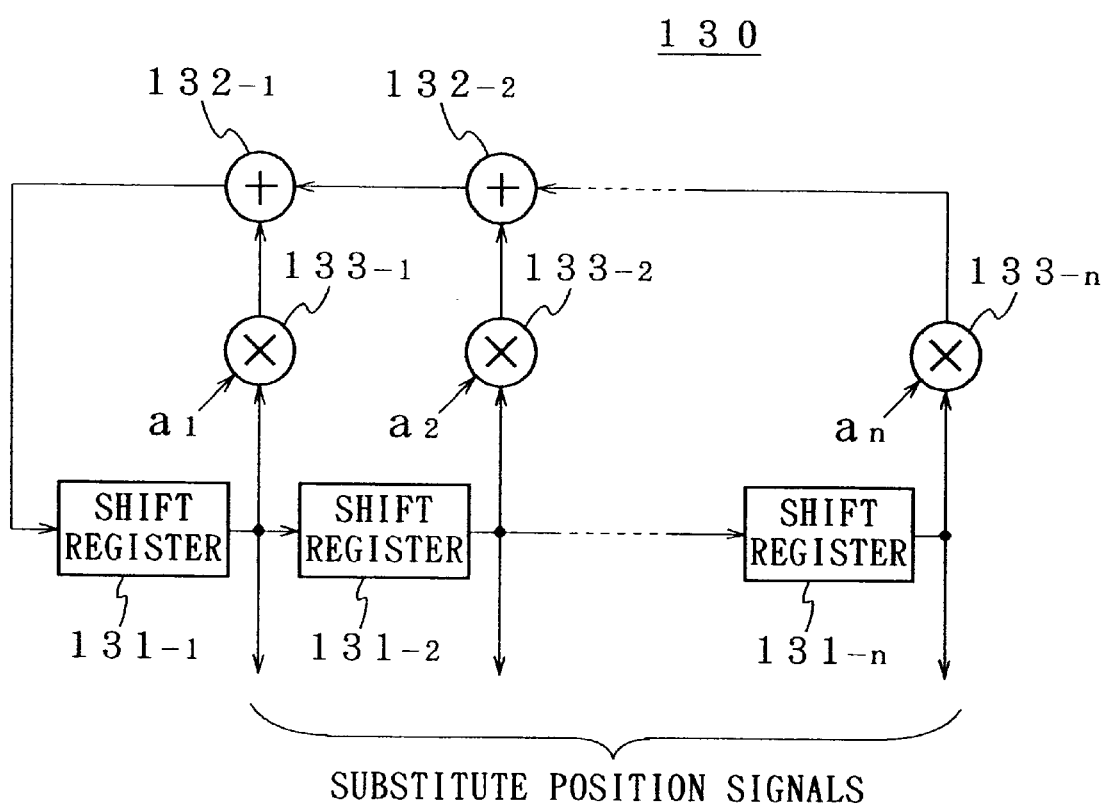
FIG. 4 is a block diagram showing an example of a configuration of an M series generating circuit.

In the data arithmetic substitution circuit 122, the substitute positions for the input data may be also calculated by an M series generating circuit 130 shown in FIG. 4 when the size N of the interleaver 120 is selected so as to take $2^n-1$ with respect to an arbitrary integer n.

The M series generating circuit 130 has a plurality of shift registers 131-1 through 131-n, a plurality of EXOR circuits 132-1 through 132-(n−1) and a plurality of AND circuits 133-1 through 133-n, and successively generates substitute position signals. Pre-set factors $a_1$ through $a_n$ are selected so that a polynomial $a_n X^n + a_{n-1} X^{n-1} + \ldots + a_2 X^2 + a_1 X 1 + 1$ reaches an n-order source or primitive irreducible polynomial in GF(2).

The shift registers 131-1 through 131-n respectively delay input data by one unit time interval and output the same therefrom, the EXOR circuits 132-1 through 132-(n−1) output EXORing of the input data respectively, and the AND circuits 133-1 through 133-n output ANDing of the input data respectively. Values are first set to all the shift registers 131-1 through 131-n so that they are not supplied with 0. Thereafter, the shift registers 131-1 through 131-n output substitute position signals every one-unit time intervals. The data arithmetic substitution circuit 122 represents substitute position signals at time i in binary numbers and represents substitute positions for the input data at positions i in binary numbers. In this condition, the data arithmetic substitution circuit 122 substitutes the input data for specified positions successively.

The operation of the turbo coding device 100 shown in FIG. 1 will be described. The input data D101 are supplied to the convolutional coding circuit 101-1. The convolution coding circuit 101-1 performs a convolution arithmetic operation on the input data D101, followed by termination. Thus, the convolution coding circuit 101-1 outputs coded data D102-1 obtained by a coding process including the termination.

Further, the input data D101 are supplied to a series circuit of the interleavers 102-1 and 102-(m−1), where the sequence of the successively-input respective data is interleaved and the so-processed respective data are outputted. These output data of the interleavers 102-1 through 102-(m−1) are respectively supplied to the convolution coding circuits 101-2 through 101-m. These convolution coding circuits 101-2 through 101-m perform convolutional arithmetic operations on the output data of the interleavers 102-1 through 102-(m−1), followed by termination. Thus, the convolution coding circuits 101-2 through 101-m output coded data D102-2 through 102-m obtained by a coding process including the termination, respectively.

According to the turbo coding device 100 shown in FIG. 1, the respective interleavers 102-1 through 102-(m−1) determine the substitute positions through the use of a simple arithmetic operation to perform the sorting of the input data. Accordingly, the substitute data ROM or the like with substitute position information stored therein becomes unnecessary for each of the interleavers 102-1 through 102-(m−1) and thereby the turbo coding device 100 can be reduced in circuit scale.

Figure 5:
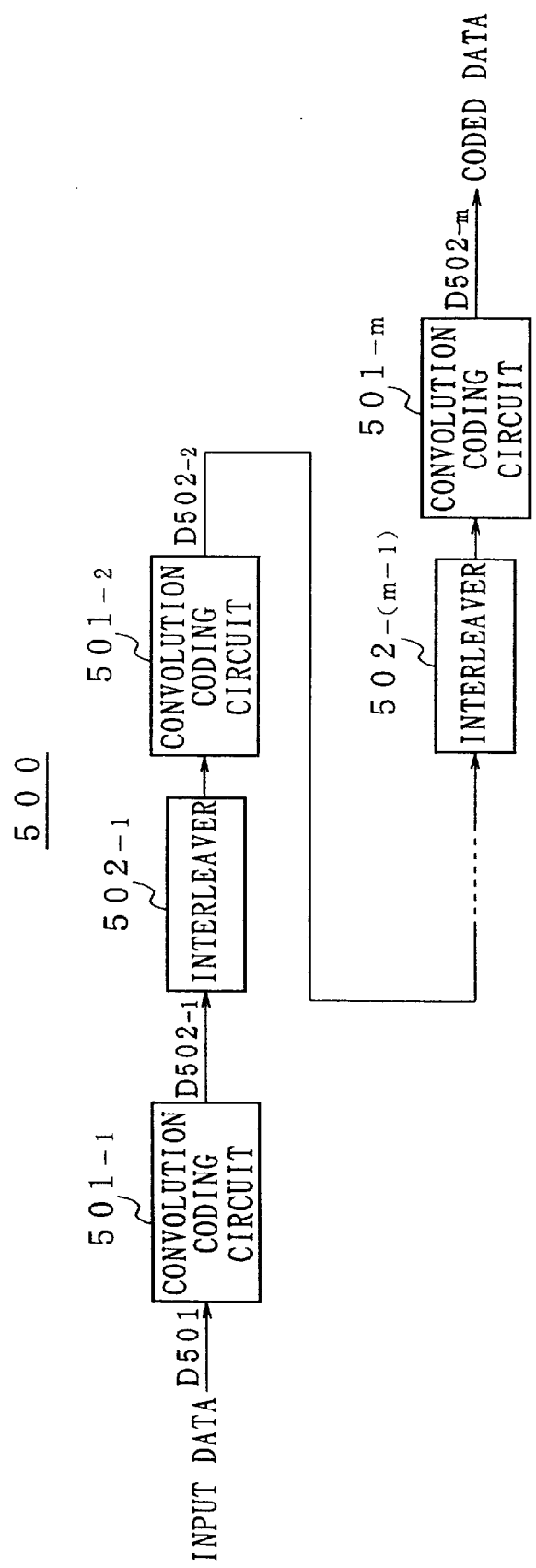
FIG. 5 is a block diagram illustrating a configuration of a series-type turbo coding device defined as an embodiment 2.

FIG. 5 shows a configuration of a series-type turbo coding device 500 illustrated as an embodiment 2.

The turbo coding device 500 has a convolution coding circuit 501-1 for performing convolutional coding on input data D501 thereby to obtain coded data D502-1, and (m−1) interleavers 502-1 through 502-(m−1) and (m−1) convolution coding circuits 502-2 through 502-m which alternately perform interleave and convolutional coding on the coded data D502-1 thereby to obtain coded data D502-m. Here, m is an integer greater than or equal to 2.

The convolution coding circuits 501-1 through 501-m perform convolutional arithmetic operations on the input data and output the results of the operations as coded data therefrom, respectively. Further, the interleavers 502-1 through 502-1 through 502-(m−1) interleave the sequence of respective data in the input data and output the so-processed data therefrom respectively.

Figure 15:
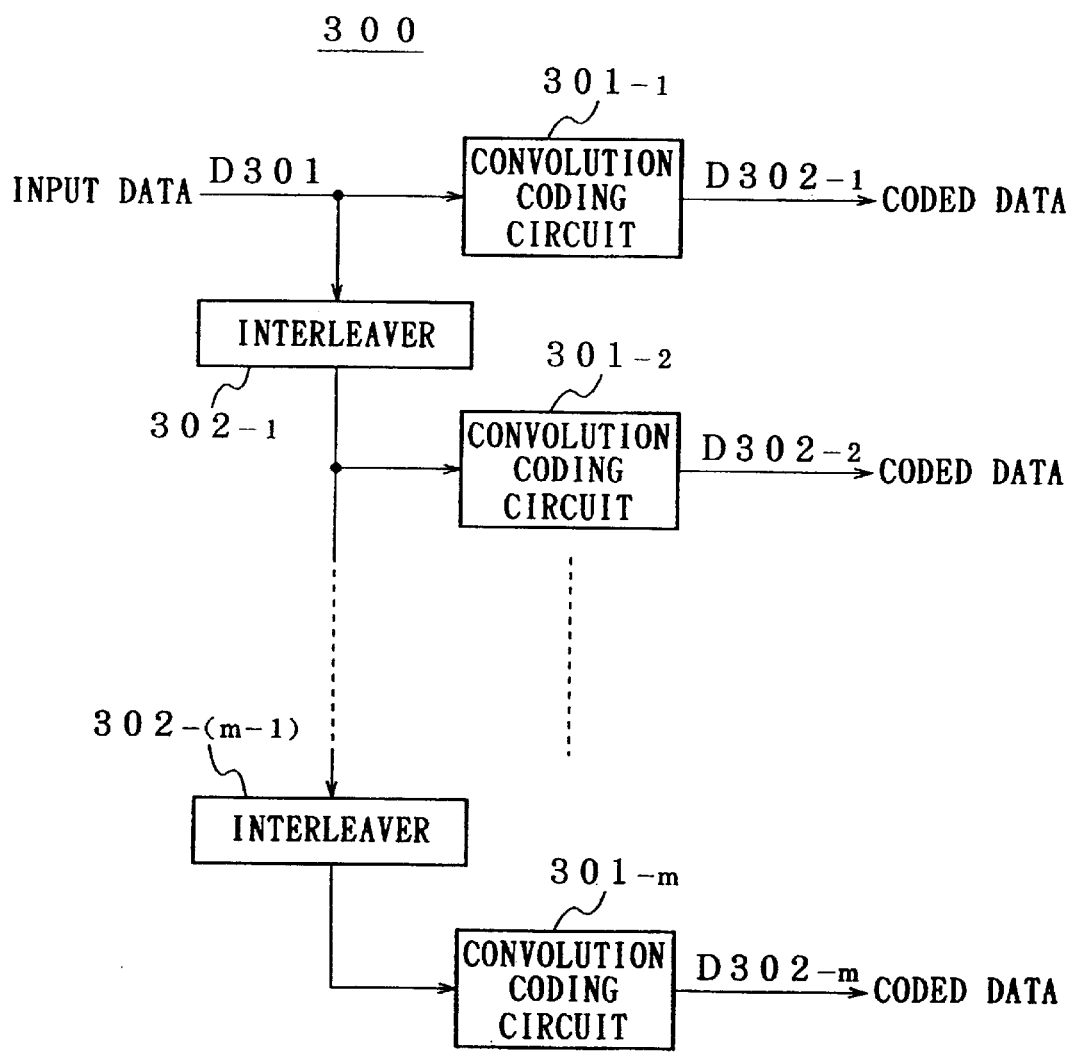
FIG. 15 is a block diagram depicting a configuration of a conventional turbo coding device.
Figure 16:
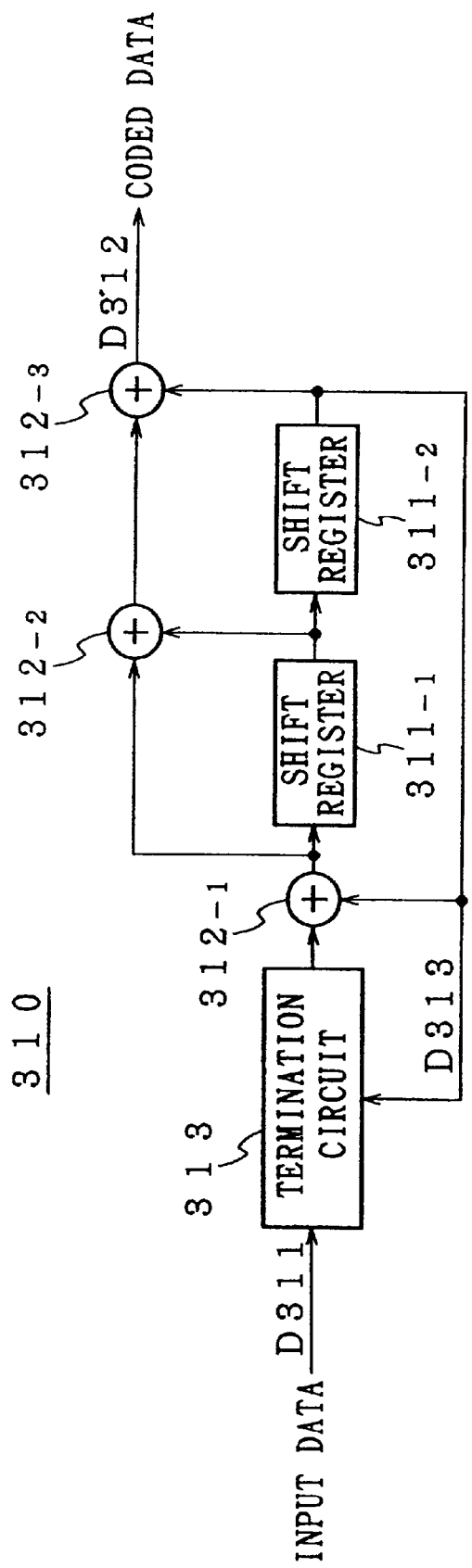
FIG. 16 is a block diagram showing a configuration of a convolution coding circuit employed in the conventional turbo coding device.

The convolution coding circuits 501-1 through 501-m are respectively constructed in a manner similar to the convolution coding circuits 301-1 through 301-m employed in the conventional turbo coding device 300 shown in FIG. 15 (see FIG. 16). Further, the interleavers 502-1 through 502-(m−1) are respectively constructed so as to have input data holding memories, data arithmetic circuits and output data holding memories in a manner similar to the interleavers 102-1 through 102-(m−1) employed in the turbo coding device 100 shown in FIG. 1 (see FIG. 2). However, the numbers of bits for the input data respectively supplied to the interleavers 102-1 through 102-(m−1) of the turbo coding device 100 are identical to each other, whereas the numbers of bits for the input data respectively supplied to the interleavers 502-1 through 502-(m−1) increase successively.

The operation of the turbo coding device 500 shown in FIG. 5 will be explained. The input data D501 are supplied to the convolution coding circuit 501-1. The convolution coding circuit 501-1 performs convolutional arithmetic operations on the input data D501, followed by termination. Thus, the convolution coding circuit 501-1 outputs coded data D502-1 obtained by a coding process including the termination.

The sequence of the coded data 502-1 is interleaved by the interleaver 502-1 and thereafter the so-processed data are supplied to the convolution coding circuit 501-2. The convolution coding circuit 501-2 performs convolutional arithmetic operations on the input data, followed by termination. Thus, the convolution coding circuit 501-2 outputs coded data D502-2 obtained by a coding process including the termination. Similarly to the above subsequently, the interleavers 502-2 through 502-(m−1) and the convolution coding circuits 501-3 through 501-m alternately perform interleave and convolutional coding. Consequently, the final coded data D502-m is outputted from the convolution coding circuit 501-m.

According to the turbo coding device 500 shown in FIG. 5, the respective interleavers 502-1 through 502-(m−1) determine substitute positions through simple arithmetic operations to perform the sorting of the input data in a manner similar to the turbo coding device 100 shown in FIG. 1. Accordingly, the substitute data ROM or the like with substitute position information stored therein becomes unnecessary for each of the interleavers 502-1 through 502-(m−1) and thereby the turbo coding device 500 can be reduced in circuit scale.

Figure 6:
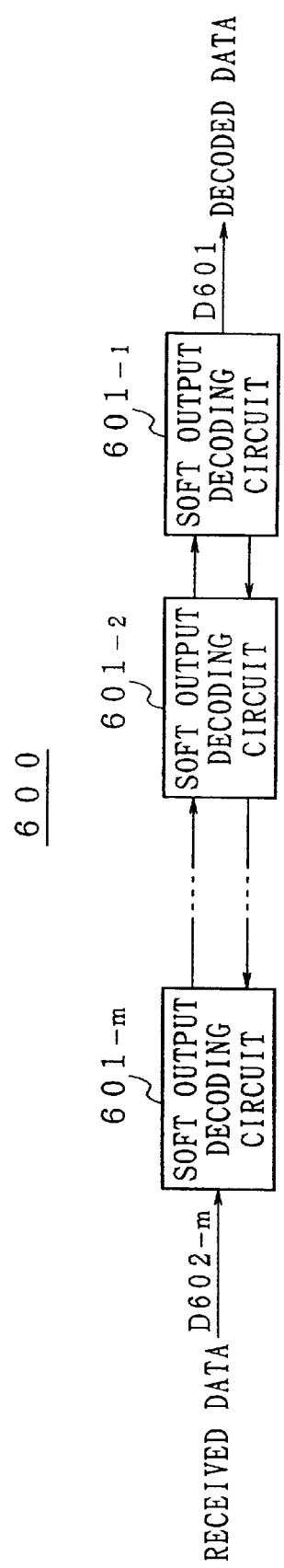
FIG. 6 is a block diagram depicting a configuration of a turbo decoding device corresponding to the series-type turbo coding device.

FIG. 6 shows a configuration of a turbo decoding device 600 corresponding to the series-type turbo coding device 500 shown in FIG. 5. The turbo decoding device 600 comprises m soft output decoding circuits 601-m through 601-1 electrically connected in series, which correspond to the convolution coding circuits 501-m through 501-1 constituting the turbo coding device 500. The soft output decoding circuits 601-m through 601-1 are constructed by using a so-called soft output decoding system having the function of calculating the probability that input data on the coding side will take 0 or 1.

In the turbo decoding device 600, the soft output decoding circuits 601-m through 601-1 successively perform decoding operations on received data D602-m, and the final-stage soft output decoding circuit 601-1 outputs the final decoded data D601 therefrom. In this case, the respective soft output decoding circuits 601-m through 601-1 respectively perform a repetitive decoding operation several times or several tens of times by utilizing estimated probability-value data with respect to the input data and output data on the coding sides, calculated by the adjacent soft output decoding circuits. Although not shown in the drawing, the decoded data obtained by the decoding operations of the soft output decoding circuits 601-m through 601-2 are subjected to de-interleave operation opposite to the interleaved operation performed in the coding device, followed by supply to the next-stage soft output decoding circuits 601-(m−1) through 601-1.

Figure 7:
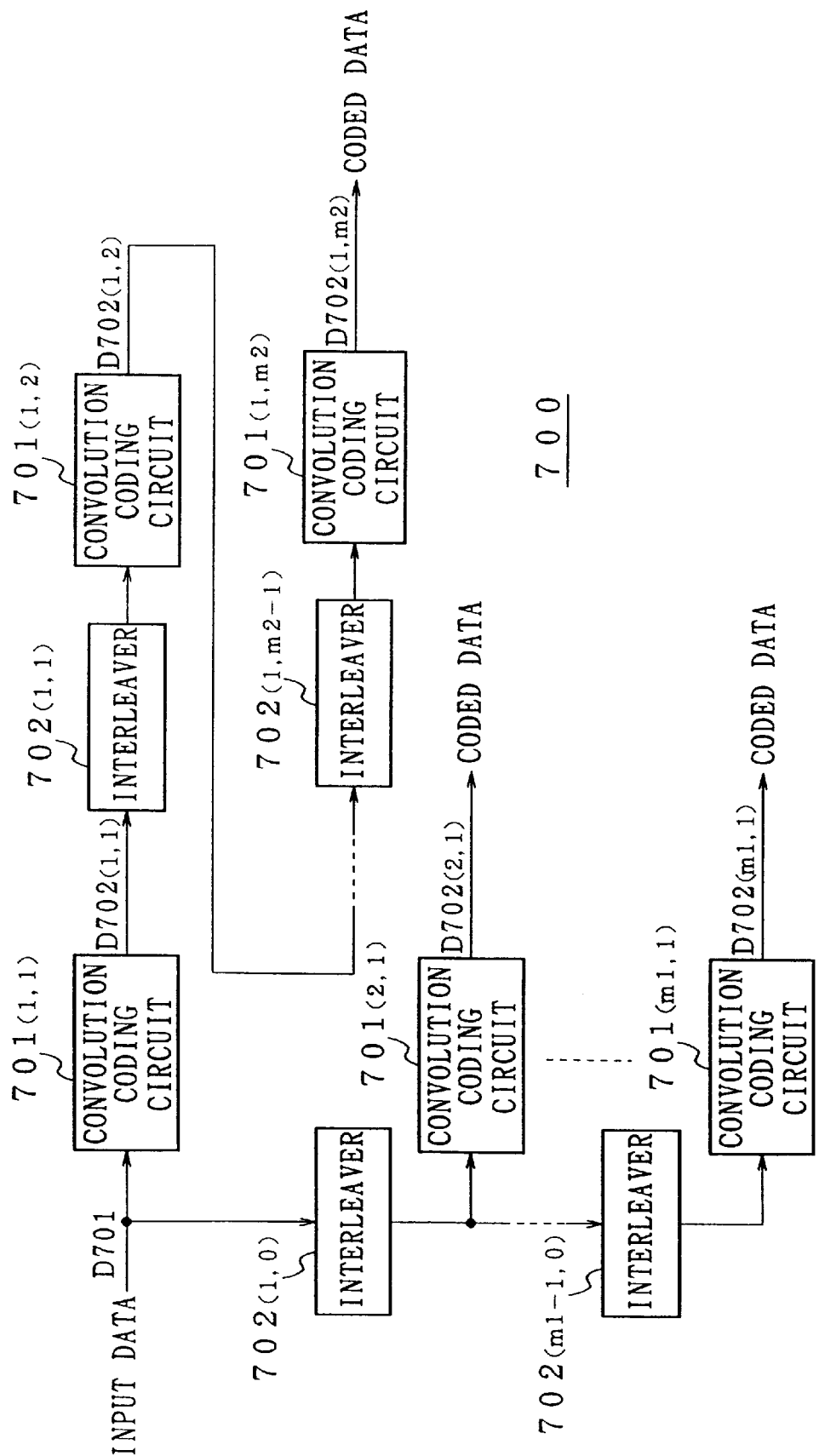
FIG. 7 is a block diagram showing a configuration of a hybrid-type turbo coding device defined as an embodiment 3.

FIG. 7 shows a configuration of a hybrid-type turbo coding device 700 illustrated as an embodiment 3.

The present turbo coding device 700 has a convolution coding circuit 701(1, 1) for performing convolutional coding on input data D701 thereby to obtain coded data D702(1, 1), and (m2−1) interleavers 702(1, 1) through 702(1, m2−1) and (m2−1) convolution coding circuits 701(1, 2) through 701(1, m2) which alternately perform interleave and convolutional coding on the coded data D702(1, 1) thereby to obtain coded data D702(1, m2) Here, m2 is an integer greater than or equal to 2.

Further, the turbo coding device 700 has (m1−1) interleavers 702(1, 0) through 702(m1−1, 0) for successively interleaving the input data D701, and (m1−1) convolution coding circuits 701(2, 1) through 701(m1, 1) for respectively performing convolutional coding on output data of these interleavers 702(1, 0) through 702(m1−1, 0) thereby to obtain coded data D702(2,1) through D702(m1, 1). Here, m1 is an integer greater than or equal to 2.

The convolution coding circuits 701(1, 1) through 701(1, m2) and 701(2, 1) through 701(m1, 1) perform convolutional arithmetic operations on the input data and output the results of the arithmetic operations as coded data therefrom, respectively. Further, the interleavers 702(1, 1) through 702(1, m2−1) and 702(1, 0) through 702(m1−1, 0) interleave the sequence of respective data in the input data and output the so-processed data therefrom respectively.

The convolution coding circuits 701(1, 1) through 701(1, m2) and 701(2, 1) through 701(m1, 1) are configured in a manner similar to the convolution coding circuits 301-1 through 301-m employed in the conventional turbo coding device 300 shown in FIG. 15 (see FIG. 16). Further, the interleavers 702(1, 1) through 702(1, m2−1) and 702(1, 0) through 702(m1−1, 0) are respectively constructed so as to have input data holding memories, data arithmetic circuits and output data holding memories in a manner similar to the interleavers 102-1 through 102-(m−1) employed in the turbo coding device 100 shown in FIG. 1 (see FIG. 2). However, the numbers of bits for the input data respectively supplied to the interleavers 102-1 through 102(m−1) of the turbo coding device 100 are identical to each other, whereas the numbers of bits for the input data respectively supplied to the interleavers 702(1, 1) through 702(1, m2−1) increase successively.

The operation of the turbo coding device 700 shown in FIG. 7 will be explained. The input data D701 are supplied to the convolution coding circuit 701(1, 1). The convolution coding circuit 701(1, 1) performs convolutional arithmetic operations on the input data D701, followed by termination. Thus, the convolution coding circuit 701(1, 1) outputs coded data D702(1, 1) obtained by a coding process including the termination.

The sequence of the coded data D702(1, 1) is interleaved by the interleaver 702(1, 1) and thereafter the so-processed data is supplied to the convolution coding circuit 701(1, 2). The convolution coding circuit 701(1, 2) performs convolutional arithmetic operations on the input data, followed by termination. Thus, the convolution coding circuit 701(1, 2) outputs coded data D702(1, 2) obtained by a coding process including the termination. Similarly to the above subsequently, the interleavers 702(1, 2) through 702(1, m2−1) and the convolution coding circuits 701(1, 3) through 701(1, m2) alternately perform interleave and convolutional coding and the convolution coding circuit D702(1, m2) outputs the final coded data D702(1, m2) therefrom.

Further, the input data D701 are supplied to a series circuit of the interleavers 702(1, 0) through 702(m1−1, 0), where the sequence of the successively-input respective data is interleaved and the so-processed respective data are outputted. The output data of these interleavers 702(1, 0) through 702(m1−1, 0) are respectively supplied to the convolution coding circuits 701(2, 1) through 701(m1, 1). These convolution coding circuits 701(2, 1) through 701(m1, 1) perform convolutional arithmetic operations on the output data of the interleavers 702(1, 0) through 702(m1−1, 0), followed by termination. Thus, the convolution coding circuits 701(2, 1) through 701(m1, 1) output coded data D702(2, 1) through D702(m1, 1) obtained by a coding process including the termination.

According to the turbo coding device 700 shown in FIG. 7, the respective interleavers 702(1, 1) through 702(1, m2−1) and 702(1, 0) through 702(m1−1, 0) determine substitute positions by simple arithmetic operations to perform the sorting of the input data, as in the case of the turbo coding device 100 shown in FIG. 1. Accordingly, the substitute data ROM or the like with substitute position information stored therein becomes unnecessary for each of the interleavers 702(1, 1) through 702(1, m2−1) and 702(1, 0) through 702(m1−1, 0) and thereby the turbo coding device 700 can be reduced in circuit scale.

As a hybrid-type turbo coding device, one is considered which has a configuration wherein in the turbo coding device 700 shown in FIG. 7, one pair of interleavers or a plurality of pairs of interleavers and pairs of convolution coding circuits are further electrically connected to the subsequent stages of some and all of the convolution coding circuits 701(2, 1) through 701(m1, 1) in a manner similar to the subsequent stages of the convolution coding circuit 701(1, 1). However, the substitute data ROM or the like with substitute position information stored therein become unnecessary by respectively setting the configurations of the interleavers to the configuration for determining substitute positions by arithmetic operations in a manner similar to the configurations of the interleavers employed in the turbo coding device 700 shown in FIG. 7, whereby the turbo coding device can be reduced in circuit scale.

Figure 8:
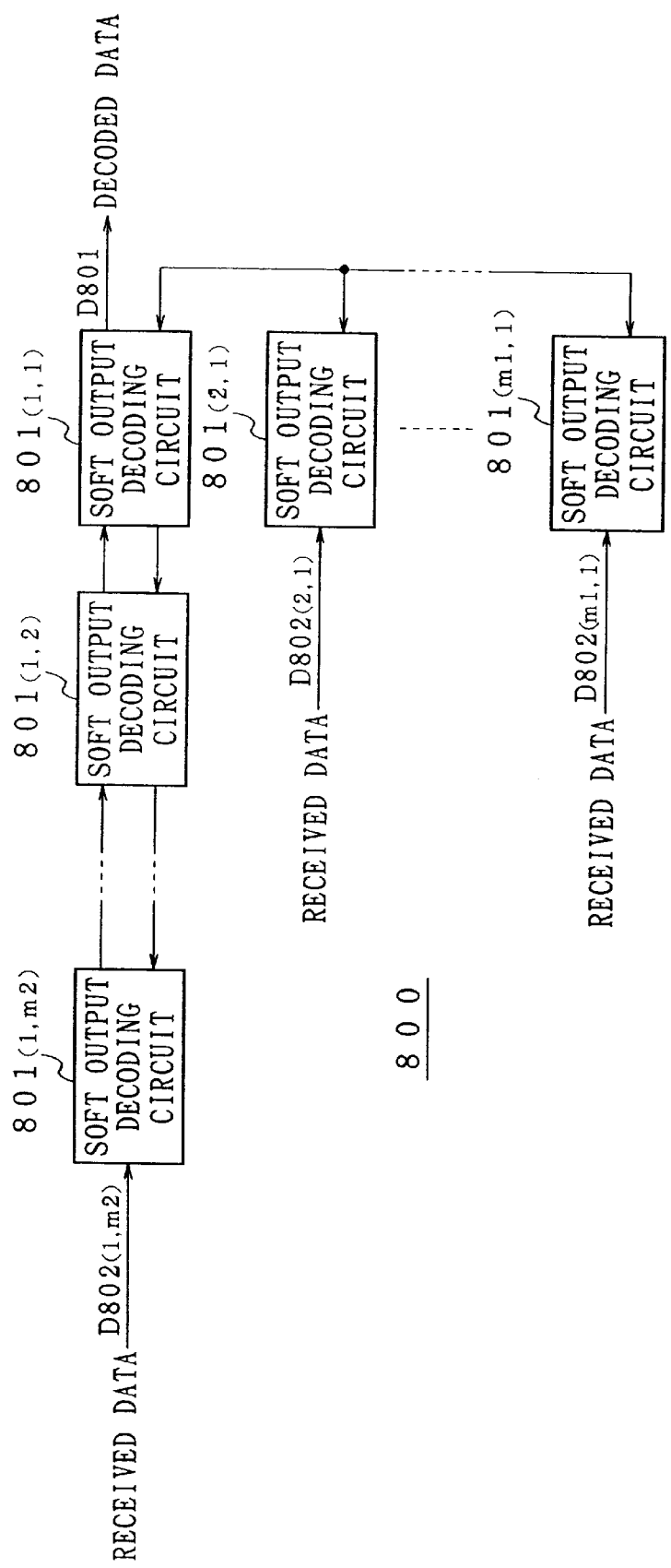
FIG. 8 is a block diagram illustrating a configuration of a turbo decoding device corresponding to the hybrid-type turbo coding device.

FIG. 8 shows a configuration of a turbo decoding device 800 corresponding to the hybrid-type turbo coding device 700 shown in FIG. 7.

The turbo decoding device 800 is constructed so as to have m2 series-connected soft output decoding circuits 801(1, m2) through 801(1, 1) corresponding to the convolution coding circuits 701(1, m2) through 701(1, 1) constituting the turbo coding device 700, and (m1−1) soft output decoding circuit 801(2, 1) through 801(m1, 1) corresponding to the convolution coding circuits 701(2, 1) through 701(m1, 1) constituting the turbo coding device 700. The soft output decoding circuits 801(1, m2) through 801(1, 1) and 801(2, 1) through 801(m1, 1) are constructed by using a so-called soft output decoding system having the function of calculating the probability that input data will take 0 or 1 on the coding side.

In the turbo decoding device 800, the soft output decoding circuits 801(1, m2) through 801(1, 1) successively perform decoding operations on received data D802(1, m2) corresponding to the coded data D702(1, m2) outputted from the turbo coding device 700. In this case, the respective soft output decoding circuits 801(1, m2) through 801(1, 1) perform a repetitive decoding operation several times or several tens of times by utilizing estimated probability-value data with respect to the input data and output data on the coding sides, calculated by the adjacent soft output decoding circuits. Although not shown in the drawing, the decoded data obtained by the decoding operations of the soft output decoding circuits 801(1, m2) through 801(1, 2) are subjected to de-interleave operation opposite to interleave operation performed in the coding device, followed by supply to the next-stage soft output decoding circuits 801(1, m2−1) through 801(1, 1).

The soft output decoding circuits 801(2, 1) through 801 (m1, 1) successively perform decoding operations on received data D802(2, 1) through D802(m1, 1) corresponding to the coded data D702(2, 1) through D702(m1, 1) outputted from the turbo coding device 700. These decoding circuits 801(2, 1) through 801(m1, 1) and the aforementioned decoding circuit 801(1, 1) respectively perform a repetitive decoding operation several times or several tens of times by utilizing estimated probability-value data with respect to the input data except for termination bits on the coding sides with each another. The final decoded data D801 are outputted from an arbitrary decoding circuit (corresponding to the decoding circuit 801(1, 1) in FIG. 8).

Figure 9:
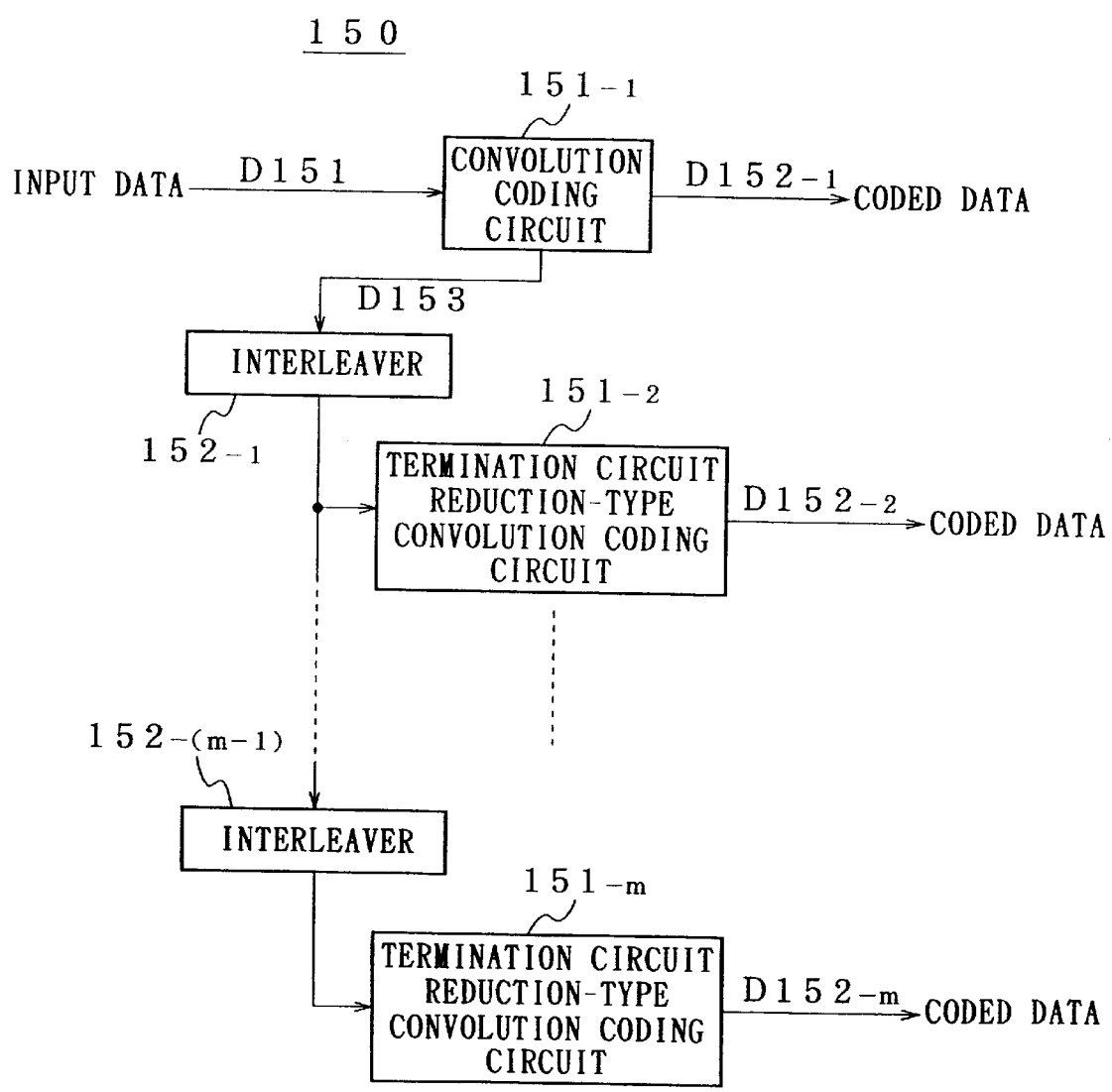
FIG. 9 is a block diagram depicting a configuration of a turbo coding device defined as an embodiment 4.

FIG. 9 shows a configuration of a turbo coding device 150 illustrated as an embodiment 4. The turbo coding device 150 has a convolution coding circuit 151-1 for performing convolutional coding on input data D151 thereby to obtain coded data D152-1, interleavers 152-1 through 152-(m−1) for successively interleaving all the input data D153 including termination bits in the convolution coding circuit 151-1, and convolution coding circuits 151-2 through 151-m for respectively performing convolutional coding on data outputted from these interleavers 152-1 through 152-(m−1) thereby to obtain coded data D152-2 through D152-m. Here, m is an integer greater than or equal to 2.

The convolution coding circuits 151-1 through 151-m perform convolutional arithmetic operations on the input data and output the results of the arithmetic operations therefrom as coded data, respectively. Further, the interleavers 1521 through 152-(m−1) interleave the sequence of respective data in the input data and output the so-processed data therefrom respectively. The convolution coding circuit 151-1 is constructed in a manner similar to the convolution coding circuits 301-1 through 301-m employed in the conventional turbo coding device 300 shown in FIG. 15 (see FIG. 16). However, the convolution coding circuits 151-2 through 151-m are constructed so as to reduce their termination circuits therefrom.

Figure 10:
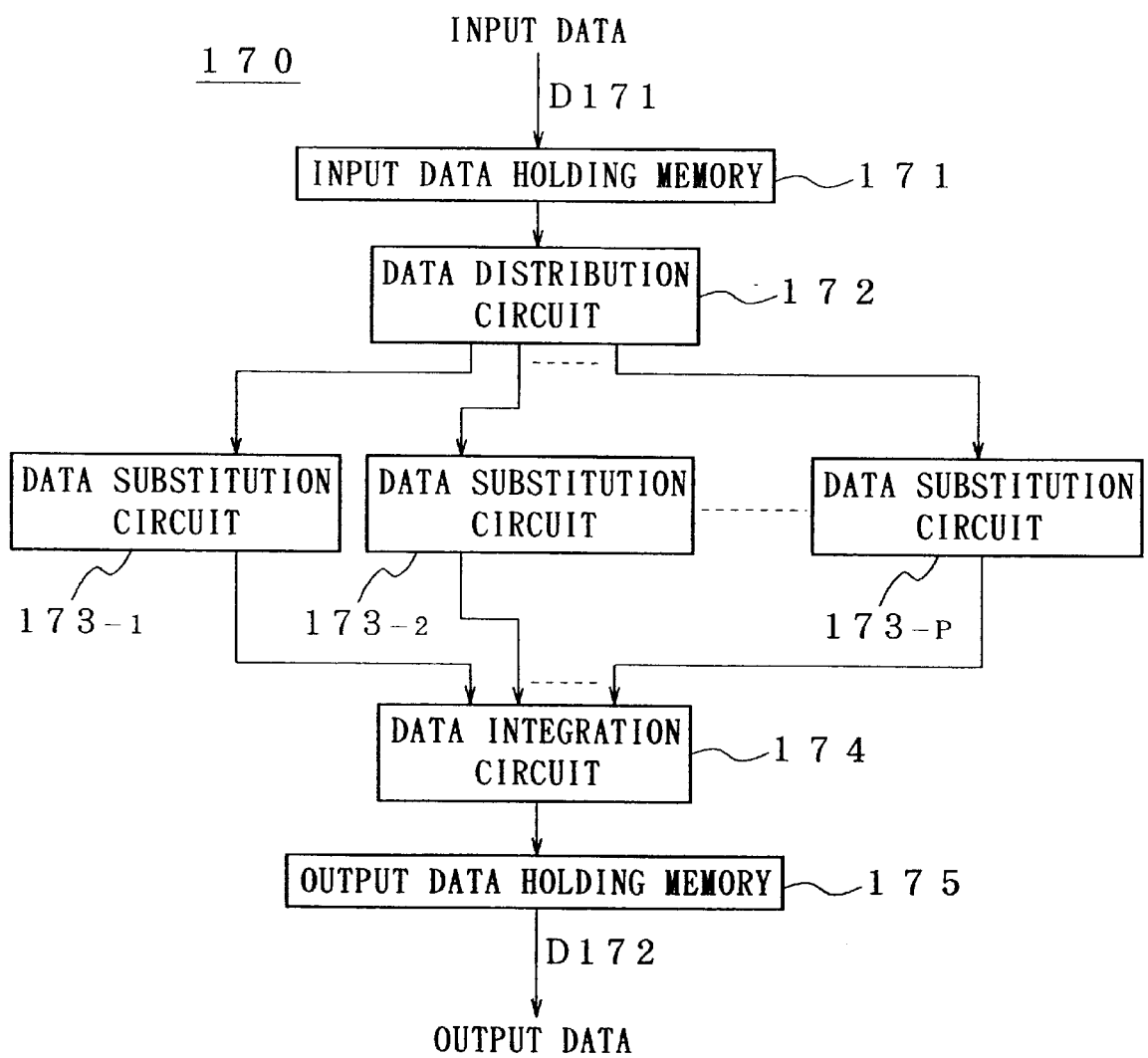
FIG. 10 is a block diagram showing a configuration of an interleaver employed in the embodiment 4.

FIG. 10 shows a configuration of each of the interleavers 152-1 through 152-(m−1). An interleaver 170 shown in FIG. 10 has an input data holding memory 171, a data distribution circuit 172, a plurality of data substitution circuits 173-1 through 173-p, a data integration circuit 174, and an output data holding memory 175. The interleaver 170 interleaves the sequence of individual data in input data D171 thereby to obtain output data D172.

Here, the input data D171 are temporarily stored in the input data holding memory 171 and thereafter divided into a plurality of portions according to their positions by the data distribution circuit 172. The plurality of portions (sets of positions and data) are respectively sent to the data substitution circuits 173-1 through 173-p. The data substitution circuits 173-1 through 173-p interleave only the sequence of data within their portions and output pairs of the input positions and interleaved data, respectively.

Further, the plurality of portions (pairs of positions and data) outputted from the data substitution circuits 173-1 through 173-p are transmitted to the data integration circuit 174. The data integration circuit 174 writes data into the output data holding memory 175 in accordance with the positions and data about the plurality of portions outputted from the data substitution circuits 173-1 through 173-p.

Incidentally, when the numbers of the data about the plurality of portions outputted from the respective data substitution circuits 173-1 through 173-p are equal to each other, the data integration circuit 174 replaces the positions paired with the data between the plurality of portions outputted from the respective data substitution circuits 173-1 through 173-p by others, and thereafter writes data into the output data holding memory 175 in accordance with the replaced positions and data. Afterwards, the contents of the output data holding memory 175 is outputted as output data D172.

Figure 11:
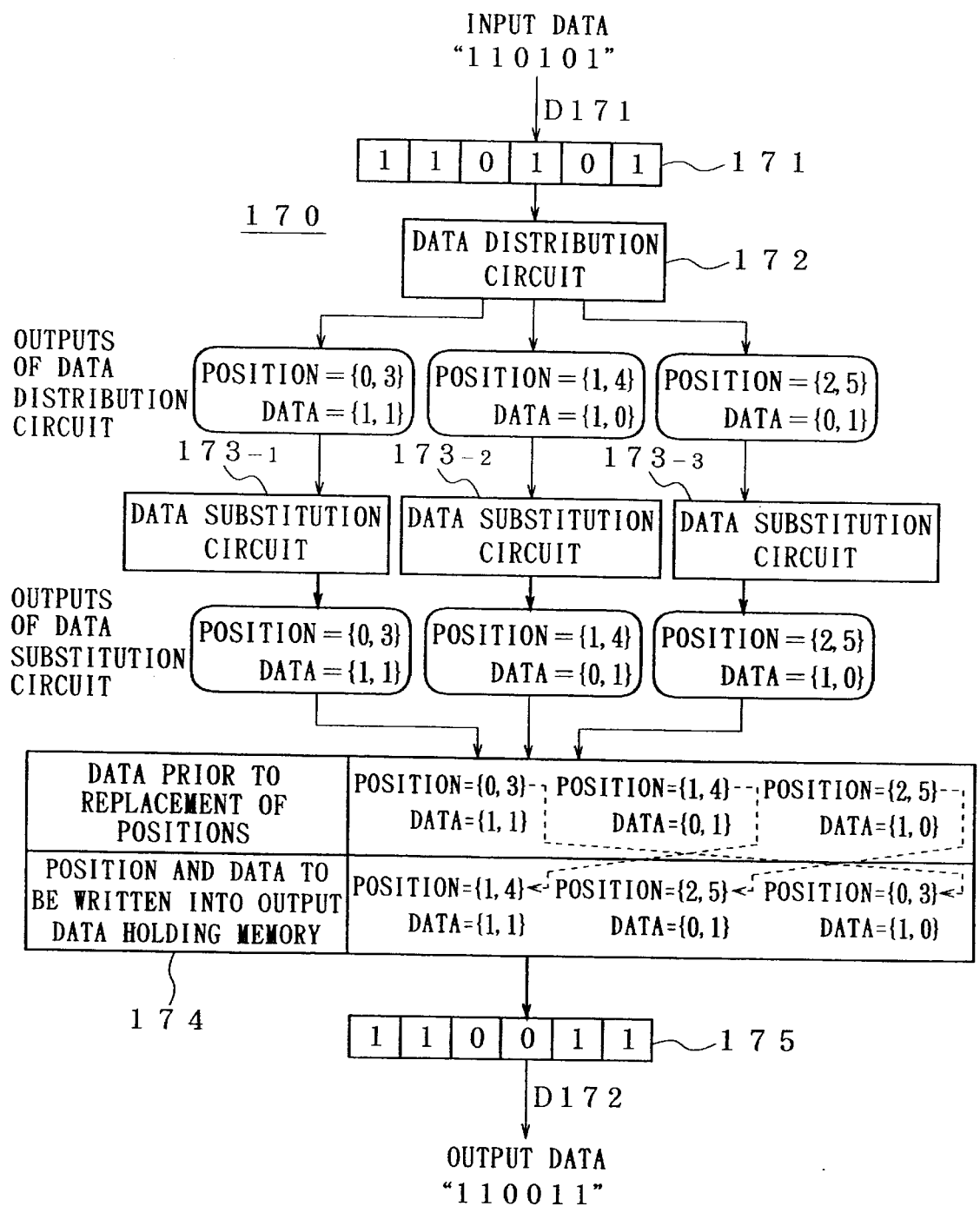
FIG. 11 is a diagram illustrating an example of the operation of the interleaver employed in the embodiment 4.

All the interleavers such as the interleavers (see FIG. 17) employed in the conventional turbo coding device 300 shown in FIG. 11, the interleavers (see FIG. 2) employed in the turbo coding device 100 shown in FIG. 1, etc. can be applied as the data substitution circuits 173-1 through 173-p of the interleaver 170 shown in FIG. 10.

FIG. 11 shows an example of the operation of the interleaver 170 at the time that the size of the interleaver 170 is 6 and the input data D171 is divided into three portions comprised of pairs of two-by-two positions and data by the data distribution circuit 172, and their portions are sent to the three data substitution circuits 173-1 through 173-3. When, in this case, the input data D171 are given as "110101", "110011" is obtained as the output data D172.

The operation of the turbo coding device 150 shown in FIG. 9 will be explained. The input data D151 are supplied to the convolution coding circuit 151-1. Further, the convolution coding circuit 151-1 performs convolutional arithmetic operations on the input data D151, followed by termination. Thus, the convolution coding circuit 151-1 outputs coded data D152-1 obtained by a coding process including the termination.

All the input data D153 including the termination bits at the convolution coding circuit 151-1 are supplied to a series circuit of the interleavers 152-1 through 152-(m−1), where the sequence of the successively-input data is interleaved and the so-processed data are outputted. These output data of the interleavers 152-1 through 152-(m−1) are respectively supplied to the convolution coding circuits 151-2 through 151-m. The convolution coding circuits 151-2 through 151-m respectively perform convolutional arithmetic operations on the output data of the interleavers 152-1 through 152-(m−1), so that the coded data D152-2 through D152-m are outputted therefrom.

Now, the convolution coding circuits 151-1 through 151-m and the interleavers 152-1 through 152-(m−1) are constructed so as to meet the following conditions.

i) Convolutional code generating polynomials employed in the m convolution coding circuits 151-1 through 151-m are set identical to each other. At this time, Q(D) in a common generating function or polynomial H(D)/Q(D) divides a polynomial $1+D^e$;

ii) The size N of the interleavers 152-1 through 152-(m−1) is a multiple of e;

iii) The data distribution circuits of the interleavers 152-1 through 152-(m−1) respectively output pairs of positions and data on the positions where the remainders obtained when data positions are divided by e, are equal to each other, to the same data substitution circuits;

iv) Data outputted from the termination circuit of the convolution coding circuit 151-1 directly supplied with the input data are interleaved inclusive of the output produced upon termination processing; and v) When a polynomial $d_{N-1}x^{N-1}+d_{N-2}x^{N-2}+ \ldots +d_1x+d_0$ with data $d_0, d_1, \ldots, d_{N-1}$ inputted to the interleavers 152-1 through 152-(m−1) as factors of an N−1-order polynomial is divided by $1+x^e$, the data integration circuits respectively perform position replacement so that a polynomial with the outputs produced from the data integration circuits as factors is also divided by $1+x^e$.

Thus, when the convolution coding circuits 151-2 through 151-m respectively perform convolutional arithmetic operations on the output data of the interleavers 152-1 through 152-(m−1), the convolution coding circuits 151-2 through 151-m automatically perform termination. That is, the convolution coding circuits 151-2 through 151-m are also terminated simultaneously with the termination of the convolution coding circuit 151-1 by the termination processing. Thus, according to the turbo coding device 150 shown in FIG. 9, the convolution coding circuits 151-2 through 151-m can be constructed so as to reduce the termination circuits as described above therefrom, whereby the turbo coding device can be reduced in circuit scale.

Figure 12:
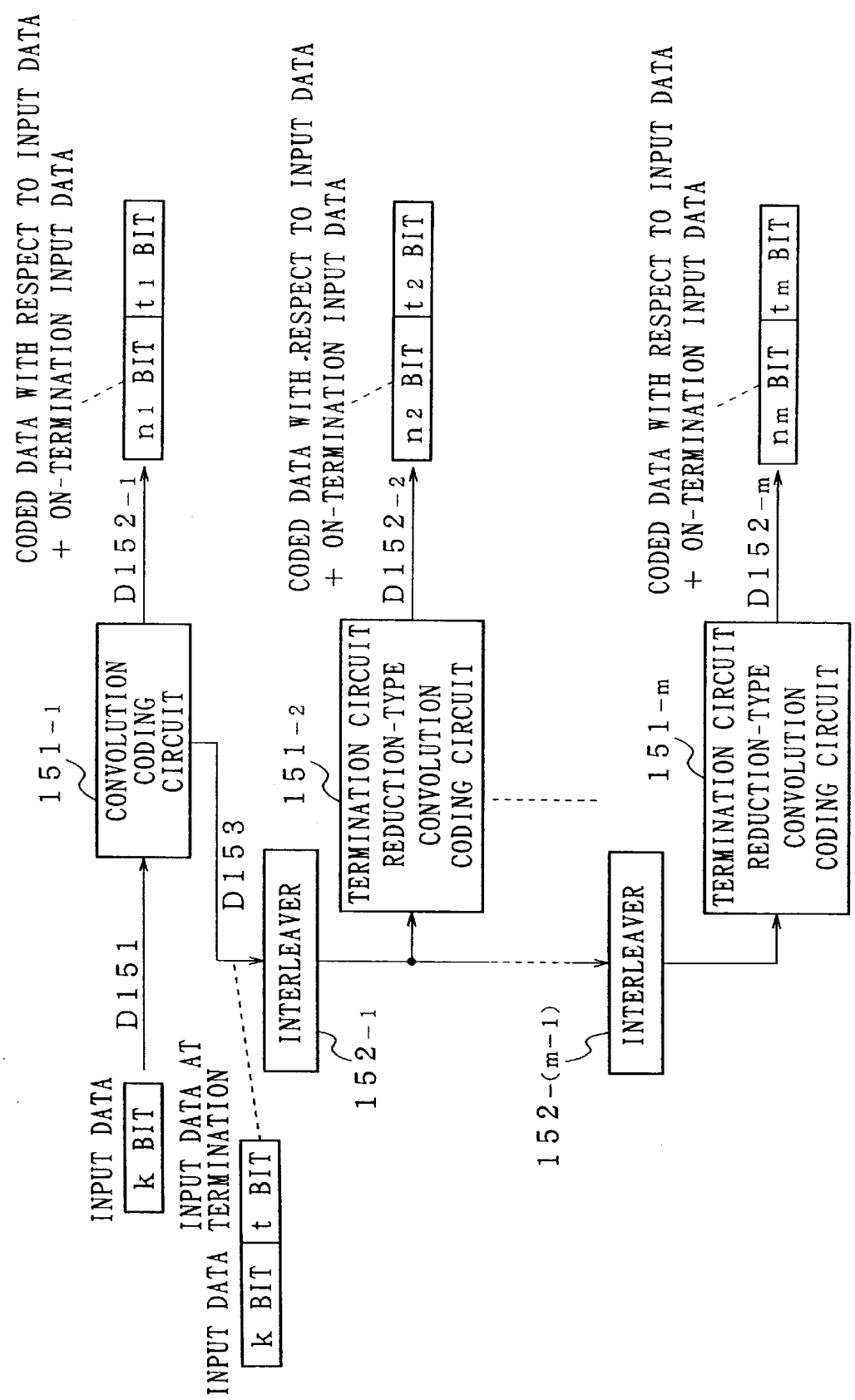
FIG. 12 is a diagram depicting the relationship between the numbers of bits for input data and coded data employed in the embodiment 4.

FIG. 12 shows the relationship between the numbers of bits for the data D151 inputted to the turbo coding device 150, the data outputted from the termination circuit of the convolution coding circuit 151-1, i.e., all the input data D153 including the termination bits in the convolution coding circuit 151-1, and the coded data D152-1 through D152-m.

The convolution coding circuit 151-1 performs coding processing including termination on input k-bit data thereby to obtain ($n_1+t_1$)-bit coded data D152-1. Next, (k+t)-bit output data from the termination circuit in the convolution coding circuit 151-1 are supplied to the interleavers 152-1 through 152-(m−1) and thereafter the coding circuits 151-1 through 151-m perform coding processing on data outputted from the interleavers 152-1 through 152-(m−1) thereby to obtain $(n_2+t_2)$ to $(n_m+t_m)$-bit coded data D152-1 through D152-m.

While the interleaver 170 shown in FIG. 10 shows the sequencing or sorting of data by both the data substitution circuits 173-1 through 173-p and the data integration circuit 174, the sorting of the data by either one of them may be performed. However, since the data sorting makes the data more stirring, an improvement in coding performance may be achieved.

Figure 13:
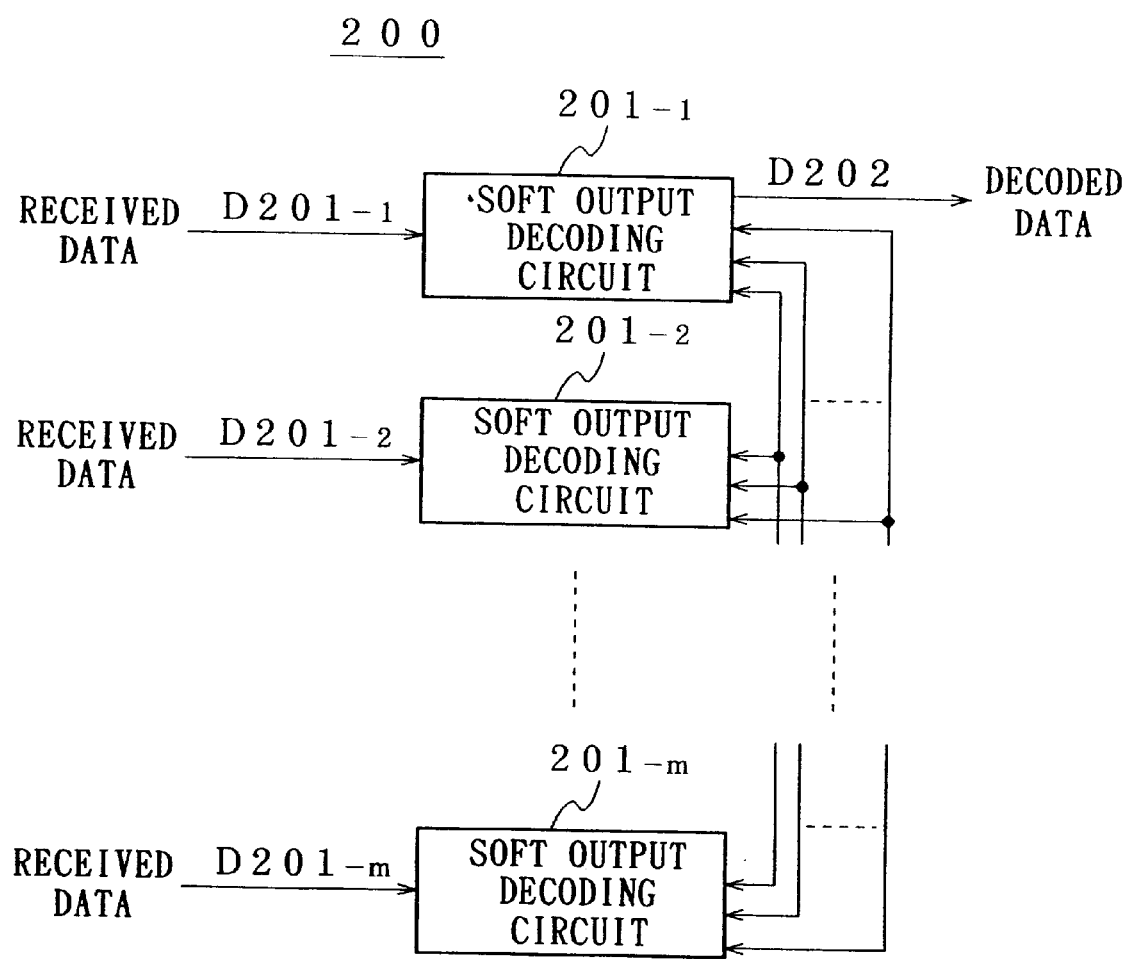
FIG. 13 is a block diagram showing a configuration of a turbo decoding device defined as an embodiment 5.

FIG. 13 shows a configuration of a turbo decoding device 200 illustrated as an embodiment 5. The present turbo decoding device 200 is one wherein decoded data are obtained from the coded data outputted from the turbo coding device 150 shown in FIG. 9. The turbo decoding device 200 has a plurality of soft output decoding circuits 201-1 through 201-m corresponding to the number of the coded data (received data) outputted from the turbo coding device 150. In a manner similar to soft output decoding circuits 401-1 through 401-m of a conventional turbo decoding device 400 shown in FIG. 21, the soft output decoding circuits 201-1 through 201-m are constructed by using a so-called soft output decoding system such as a MAP decoder and a SOVA decoder or the like, having the function of calculating the probability that input data on the coding side will take 0 or 1.

The operation of the turbo decoding device 200 shown in FIG. 13 will be described. Received data (coded data) D201-1 through D201-m are respectively supplied to the soft output decoding circuits 201-1 through 201-m. The respective decoding circuits 201-1 through 201-m respectively perform a repetitive decoding operation several times or several tens of times, utilizing estimated probability-value data with respect to the input data on the coding sides with one another. The final decoded data D202 are outputted from an arbitrary decoding circuit (corresponding to the decoding circuit 201-1 in FIG. 13). Here, the plurality of coded data outputted from the turbo coding device 150 shown in FIG. 9 are those all generated from the same data inclusive of the on-termination data as described above. The transfer of the estimated probability-value data with respect to all the input data including the termination bits is performed between the respective decoding circuits 201-1 through 201-m so that the coded data can be decoded. Thus, the turbo decoding device 200 shown in FIG. 13 can be improved in decoding performance as compared with the conventional turbo decoding device 200 shown in FIG. 21.

Figure 14:
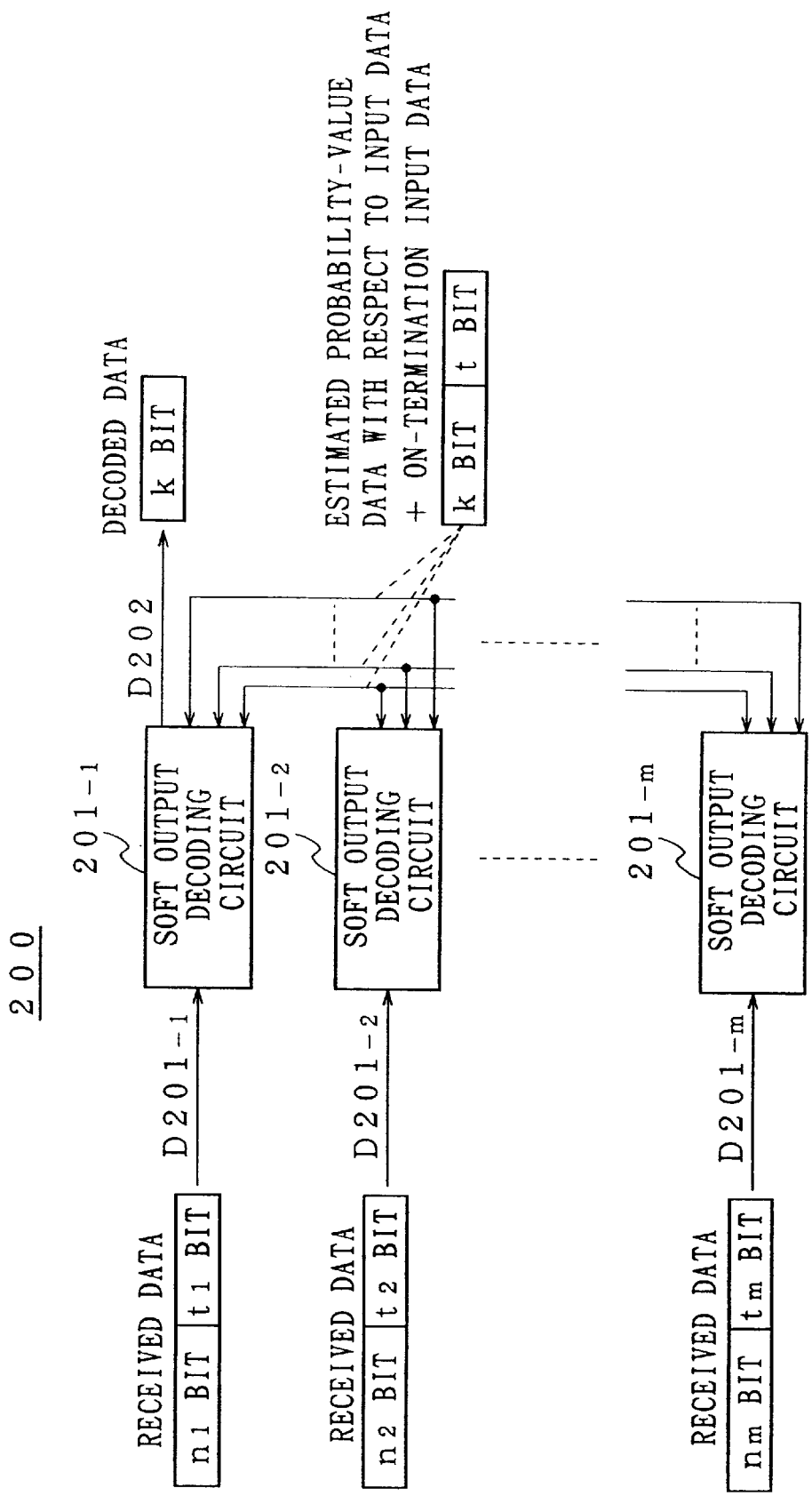
FIG. 14 is a diagram illustrating the relationship between the numbers of bits for received data (coded data), estimated probability-value data and decoded data.

FIG. 14 shows the relationship between the numbers of bits for the received data D201-1 through D201-m, estimated probability-value data and decoded data D202 employed in the turbo decoding device 200 and correspond to the relationship between the respective numbers of the bits employed in the turbo coding device 150 shown in FIG. 12. The soft output decoding circuits 201-1 through 201-m respectively calculate (k+t)-bit estimated probability-value data with respect to the input data and on-termination input data from $(n_1+t_1)$-bit to $(n_m+t_m)$-bit received data D201-1 through D201-m. The (k+t)-bit estimated probability-value data are transferred between the respective decoding circuits to finally output k-bit decoded data D202.

According to the present invention, as has been described above, the substitute positions to replace respective data inputted upon interleave processing in a turbo coding device with others are respectively determined by arithmetic operations. It is possible to eliminate the need for a memory for holding the substitute positions and reduce the turbo coding device in circuit scale.

According to the present invention as well, limitations are imposed on substitute positions of interleave circuits in a turbo coding device. Further, all the input data including termination bits employed in the first convolution coding circuit are inputted to the interleave circuits. The second and subsequent convolution coding circuits of the turbo coding device automatically perform termination without termination circuits, so that the turbo coding device can be reduced in circuit scale.

Further, according to the present invention, when a plurality of coded data are all generated from the same data inclusive of on-termination data, estimated probability-value data with respect to all the input data including termination bits are respectively transferred between respective decoding circuits of a turbo decoding device thereby to decode coded data, whereby the decoding device can be improved in decoding performance.

Industrial Applicability

As described above, the turbo coding device and the turbo decoding device or the like according to the present invention are suitable for application to a coding device and a decoding device employed in satellite communications, mobile communications, etc.

What is claimed is:

1. A turbo coding device, comprising:
   a first convolution coding circuit for performing convolution coding on input data;
   first to (m−1)th (where m is an integer≧2) interleave circuits for successively interleaving the input data; wherein said first to (m−1)th interleave circuits respectively have a data arithmetic substitution circuit for computing substitute positions πi for respective data in the input data; and
   second to mth convolution coding circuits for respectively performing convolution coding on data output from the first to (m−1)th interleave circuits.

2. The turbo coding device according to claim 1, wherein said first to (m−1)th interleave circuits and said second to mth convolution coding circuits are configured in series and which alternately perform interleave and convolution coding processes on data output from said first convolution coding circuit.

3. The turbo coding device according to claim 1, wherein said each data arithmetic substitution circuit determines said substitute positions πi corresponding to positions i for the respective data in the input data from πi=(a·i+b)modN with the size of said each interleave circuit as N, an integer prime relative to N with each other as a and an arbitrary integer as b.

4. The turbo coding device according to claim 1, wherein said data arithmetic substitution circuit determines said substitute positions πi corresponding to positions i for the respective data in the input data from πi=(a·$π_{i-1}$+b)modN (where $π_0$=c modN when c is defined as an arbitrary integer) with the size of said each interleave circuit as N, and predetermined integers as a and b.

5. The turbo coding device according to claim 4, wherein when said b is 0, said a is such an integer as to meet $a^p$≠1 (2≦p≦N−2).

6. The turbo coding device according to claim 4, wherein when said b is not 0, N is set to a number reduced by one from said N, and said a and b respectively meet the conditions that b and N are prime with each other, a−1 is a multiple of all the prime numbers which divide N, and where N is a multiple of four, then a−1 is also the multiple of four.

7. The turbo coding device according to claim 4, wherein said data arithmetic substitution circuit determines the substitute positions πi corresponding to the positions i for the respective data in the input data by using an M series generating circuit.

8. The turbo coding device according to claim 1, wherein the input data is divided into a plurality of portions with each portion including termination bits;

said first to (m−1)th interleave circuits successively interleaving the input data including the termination bits so that the coded data output from said second to mth convolution coding circuits automatically terminates.

9. The turbo coding device according to claim 8, wherein said first to (m−1)th interleave circuits interleave the data inside each of said plurality of portions individually.

10. The turbo coding device according to claim 8, wherein said first to (m−1)th interleave circuits interleave the input data in units of portions.

11. The turbo coding device according to claim 8, wherein said first to (m−1)th interleave circuits interleave the data inside each of said plurality of portions individually and interleave said plurality of portions themselves.

12. A turbo decoding device for decoding turbo encoded data, comprising:

a plurality of soft output decoding circuits connected in series for successively performing decoding operations on the turbo encoded data, wherein said plurality of soft output decoding circuits perform a transfer of estimated probability-value data with respect to all the input data including termination bits therebetween, thereby decoding the encoded data, and a plurality of de-interleave circuits corresponding to said plurality of soft output decoding circuits, the de-interleave circuits performing a de-interleave operation on the output of a corresponding soft output decoding circuit and passing the de-interleaved data onto a next soft output decoding circuit.

13. A turbo coding method, comprising the following steps:

a first convolution coding step for performing convolution coding on input data using a convolution coding circuit;

first to (m−1)th (where m is an integer $\geq 2$) interleave steps for successively interleaving the input data using interleaver circuits;

wherein in said first to (m−1)th interleave steps, substitute positions πi for respective data in the data to be interleaved are determined by computation using a data arithmetic substitution circuit; and second to mth convolution coding steps for respectively performing convolution coding on data output from the first to (m−1)th interleave steps using convolution coding circuits.

14. The turbo coding method according to claim 13, wherein said first to (m−1)th interleave steps and said second to mth convolution coding steps are performed in an alternating serial manner so that the data output from said first convolution coding step is alternately interleaved and convolved.

15. The turbo coding method according to claim 13, wherein in said interleave step, said substitute positions πi corresponding to positions i for the respective data in the data to be interleaved are determined from πi=(a·i+b)modN with the size of said interleave as N, an integer prime relative to N with each other as a and an arbitrary integer as b.

16. The turbo coding method according to claim 13, wherein in said interleave step, said substitute positions πi corresponding to positions i for the respective data in the data to be interleaved are determined from πi=(a·$\pi_{i-1}$+b) modN (where $\pi_0$=c modN when c is defined as an arbitrary integer) with the size of said interleave as N, and predetermined integers as a and b.

17. The turbo coding method according to claim 16, wherein when said b is 0, said a is such an integer as to meet $a^p \neq 1$ ($2 \leq p \leq N-2$).

18. The turbo coding method according to claim 16, wherein when said b is not 0, N is set to a number reduced by one from said N, and said a and b respectively meet the conditions that b and N are prime with each other, a−1 is a multiple of all the prime numbers which divide N, and where N is a multiple of four, then a−1 is also the multiple of four.

19. The turbo coding method according to claim 13, wherein in the interleave steps, the substitute positions πi corresponding to the positions i for the respective data in the input data to be interleaved are determined by an M series generation circuit.

20. A turbo decoding method for decoding turbo encoded data, comprising the following steps:

a decoding step for decoding the encoded data by using a plurality of soft output decoding circuits, wherein in said decoding step, a transfer of estimated probability-value data with respect to input data including termination bits is performed between said plurality of soft output decoding circuits thereby decoding the encoded data, and a de-interleaving step for de-interleaving the output of said plurality of soft output decoding circuits and passing the de-interleaving data onto a next soft output decoding circuit, said de-interleaving step being performed using a plurality of de-interleave circuits which correspond to said plurality of soft output decoding circuits.

* * * * *